United States Patent
Azuma et al.

(10) Patent No.: US 8,848,426 B2
(45) Date of Patent: Sep. 30, 2014

(54) CROSS-POINT VARIABLE RESISTANCE NONVOLATILE MEMORY DEVICE AND READING METHOD FOR CROSS-POINT VARIABLE RESISTANCE NONVOLATILE MEMORY DEVICE

(71) Applicant: Panasonic Corporation, Osaka (JP)

(72) Inventors: Ryotaro Azuma, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/047,214

(22) Filed: Oct. 7, 2013

(65) Prior Publication Data

US 2014/0104925 A1    Apr. 17, 2014

(30) Foreign Application Priority Data

Oct. 11, 2012    (JP) .................................. 2012-226273

(51) Int. Cl.
*G11C 11/00* (2006.01)
*G11C 13/00* (2006.01)

(52) U.S. Cl.
CPC .................................. *G11C 13/004* (2013.01)
USPC ....... 365/148; 365/203; 365/230.06; 365/207

(58) Field of Classification Search
CPC ........... G11C 13/0004; G11C 13/0069; G11C 13/004; G11C 7/12; G11C 7/062; G11C 7/065; G11C 8/08
USPC ........ 365/148, 203, 230.06, 207, 158, 185.21
See application file for complete search history.

(56) References Cited

U.S. PATENT DOCUMENTS

| | | | |
|---|---|---|---|
| 7,145,824 B2 | 12/2006 | Bill et al. | |
| 7,606,086 B2 | 10/2009 | Inoue | |
| 8,310,858 B2 | 11/2012 | Ito | |
| 8,310,891 B2 * | 11/2012 | Kim et al. | 365/203 |
| 2006/0215439 A1 | 9/2006 | Bill et al. | |
| 2007/0242528 A1 | 10/2007 | Inoue | |
| 2011/0051495 A1 | 3/2011 | Ito | |

FOREIGN PATENT DOCUMENTS

| | | |
|---|---|---|
| JP | 11-168832 | 6/1999 |
| JP | 2007-287192 | 11/2007 |
| JP | 2008-533645 | 8/2008 |
| JP | 2010-015662 | 1/2010 |
| JP | 2011-054232 | 3/2011 |
| WO | 2006/102391 A2 | 9/2006 |
| WO | 2006/102391 A3 | 9/2006 |

* cited by examiner

*Primary Examiner* — David Lam
(74) *Attorney, Agent, or Firm* — Wenderoth, Lind & Ponack, L.L.P.

(57) ABSTRACT

A cross-point variable resistance nonvolatile memory device comprises: a memory cell array; a column decoder and pre-charge circuit which pre-charges a selected word line to a first voltage in a period P1 among the period P1, a period P2, and a period S that are included in this order in a read operation of a memory cell; a low decoder driver which pre-charges a selected word line to the first voltage in the periods P1 and P2 and sets the selected word line to a third voltage different from the first voltage in the period S; a feedback controlled bit line voltage clamp circuit which sets the selected bit line to a second voltage in the periods P2 and S; and a sense amplifier which determines the resistance state in a memory cell at a cross-point of the selected word line and the selected bit line in the period S.

17 Claims, 20 Drawing Sheets

CROSS-POINT VARIABLE RESISTANCE NONVOLATILE MEMORY DEVICE AND READING METHOD FOR CROSS-POINT VARIABLE RESISTANCE NONVOLATILE MEMORY DEVICE

CROSS REFERENCE TO RELATED APPLICATION

The present application is based on and claims priority of Japanese Patent Application No. 2012-226273 filed on Oct. 11, 2012. The entire disclosure of the above-identified application, including the specification, drawings and claims is incorporated herein by reference in its entirety.

FIELD

The present disclosure relates to a nonvolatile memory device having a cross-point memory cell array comprising variable resistance elements, and a reading method for the nonvolatile memory device.

BACKGROUND

In recent years, research and development are conducted on a nonvolatile memory device having memory cells that use variable resistance elements. A variable resistance element is an element that has a property that a resistance value changes (reversibly changes between a high resistance state and a low resistance state) according to an electrical signal and enables information to be written by this change in resistance value.

One structure of memory cells using variable resistance elements that is suitable for high integration is a cross-point structure. In the memory cells of the cross-point structure, each memory cell is placed at a different one of cross-points of orthogonally arranged bit lines and word lines so as to be provided between a bit line and a word line. Various types of such cross-point variable resistance nonvolatile memory devices are developed in recent years.

For example, Patent Literature 1 discloses a cross-point nonvolatile memory device using a variable resistor as a memory cell.

FIG. 21 is a block diagram showing a voltage system used in the nonvolatile memory device in Patent Literature 1. The voltage system 400 is a system which adjusts a voltage applied to a selected memory cell in the memory cell array at the time of read, and includes a sensing circuit 404, a bias circuit 408, and a differential amplifier 450. The sensing circuit 404 includes a first resistor 410, a sensing device 420, a selection diode 430, and a variable resistance element 440. A read operation can be performed by providing a read operation voltage to the selected memory cell comprises the selection diode 430 and the variable resistance element 440.

When an ambient temperature changes during the read operation and/or a process of the selection diode 430 has been changed, a threshold voltage of the selection diode 430 can be changed. For example, when the ambient temperature is increased, a threshold voltage can be decreased. When the threshold voltage of the selection diode 430 is changed in such a manner, a read operation voltage for the variable resistance element 440 can be changed.

In order to compensate a change in the read operation voltage, the bias circuit 408 holds a constant read operation voltage by generating a reference voltage to be applied to the variable resistance element 440. The bias circuit 408 can include a second resistor 460, a reference diode 470 having the same type as that of the selection diode 430, and a reference resistance element 480. The reference diode 470 provides a capability of tracking any change in the variable resistance element 440. When a reference voltage is generated in the bias circuit, the reference voltage is provided to the sensing circuit via the differential amplifier 450.

Patent Literature 1 discloses that a constant read operation voltage is held in the variable resistance element 440, regardless of any change in threshold voltage of the selection diode 430 by the application of a reference voltage generated by the bias circuit 408. Moreover, Patent Literature 1 discloses that a read operation voltage tracking a change in threshold of the selection diode is held and it is possible to apply the best voltage for read tracking a change in threshold of the selection diode.

Moreover, for example, Patent Literature 2 discloses a power source device using a differential amplifier.

FIG. 22 is a block diagram showing a power source device disclosed in Patent Literature 2.

The power source device 500 includes: an input terminal which inputs AC or DC power; a main circuit 511 which is connected to the input terminal and converts the input power into a DC output; a voltage drop element 513 which is connected to between one of the ends of the output of the main circuit 511, leads the output of the main circuit 511 to a DC output terminal, and restricts the back current; a first circuit (operational amplifier) 510 which compares a reference voltage 508 with a voltage obtained from one end of the output of the main circuit 511, and controls the output of the main circuit 511 by feeding the result back to the main circuit 511; a second circuit 503 which generates a signal in proportion to an output signal of the main circuit 511; and a third circuit 509 which generates, from the output signal of the second circuit 503, voltage drop characteristics having the effectively same characteristics as that of voltage drop characteristics of the voltage drop element 513, and adds it to the reference voltage of the first circuit 510.

In the power source device 500, a differential amplifier (called an operational amplifier in Patent Literature 2) is used, as the first circuit 510, for steadily stabilizing DC output voltage, and a feedback connection to the main circuit 511 is comprised.

CITATION LIST

Patent Literature

Patent Literature 1: Japanese Unexamined Patent Application Publication (Translation of PCT Application) No. 2008-533645

Patent Literature 2: Japanese Unexamined Patent Application Publication No. 11-168832

SUMMARY

Technical Problem

However, the voltage system and the power source device using the conventional technique is not suitable for an operation power source which enhances low current consumption and high-speed stable operation in the nonvolatile memory device since the voltage system and the power source device using the conventional technique do not have a high-speed rising of output voltage at the time of start. In light of the problem, however, Patent Literature 1 and Patent Literature 2 fail to suggest an effective way to enhance low power consumption and high speed operation.

The present disclosure is conceived to solve the aforementioned problem, and an object of the present disclosure is to provide a cross-point variable resistance nonvolatile memory device which is suitable for enhancing low power consumption and high-speed stable operation.

Solution to Problem

An aspect of the cross-point variable resistance nonvolatile memory device according to the present disclosure is a cross-point variable resistance nonvolatile memory device comprising: a cross-point memory cell array including memory cells each including (i) a variable resistance element that reversibly changes at least between a low resistance state and a high resistance state when different voltages are applied to the variable resistance element and (ii) a current steering element that is connected in series with the variable resistance element and has nonlinear current-voltage characteristics, the memory cells being placed at respective cross-points of a plurality of bit lines and a plurality of word lines; a column decoder and pre-charge circuit which pre-charges a selected bit line to a first voltage in a first pre-charge period among the first pre-charge period, a second pre-charge period, and a sense period that are included in this order in a period of a read operation which determines whether a selected memory cell selected from the memory cells is in the low resistance state or the high resistance state, the selected bit line being one of the bit lines which is connected to at least the selected memory cell; a low decoder driver which pre-charges a selected word line to the first voltage in the first pre-charge period and the second pre-charge period, and which sets the selected word line to a third voltage in the sense period, the selected word line being one of the word lines which is connected to at least the selected memory cell, the third voltage being different from the first voltage; a feedback controlled bit line voltage clamp circuit which sets the selected bit line to a second voltage and maintains the second voltage in the second pre-charge period and the sense period; and a sense amplifier circuit which determines in the sense period, according to an amount of current flowing through the selected memory cell, whether the variable resistance element in the selected memory cell is in the low resistance state or the high resistance state.

Advantageous Effects

With the cross-point variable resistance nonvolatile memory device, when reading the selected memory cell, a circuit for reading a memory cell starts at a high speed, by setting and providing the best voltage linked to characteristics of the current steering element to the selected bit line in a short time with the feedback controlled bit line voltage clamp circuit. As a result, it is easier to frequently stop the circuit without sacrificing high-speed stable operation, and it is possible to enhance low power consumption and high-speed stable operation.

Furthermore, since a voltage shift, in other words, an increase in voltage can be reduced by making pre-charge at the time of read a two-stage pre-charge in which the overall memory cell array is pre-charged and then a selected bit line is pre-charged, it is possible to realize a more stable read operation.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT

Figure 1A:
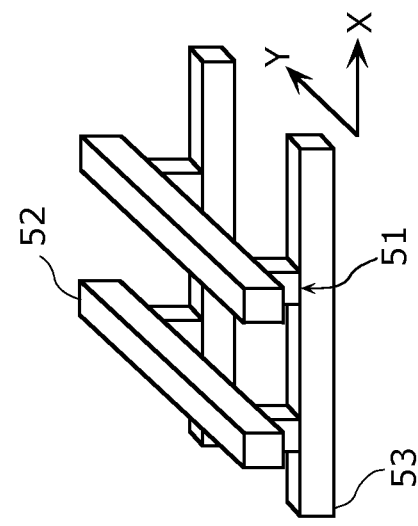
FIG. 1A is a diagram showing a three-dimensional structure showing an example of a single-layer cross-point memory cell array.

First, as a preparation for describing Embodiment, an analysis of problems by inventors and a result of considering solutions will be described in detail.

The configuration disclosed in Patent Literature 1 good for the case where it is assumed that a voltage continues to be steadily applied to the selected memory cell. However, a storage device generally changes a voltage applied to the selected memory cell with a change in operational modes of standby, read, and write. It is necessary to stop the differential amplifier 450 and the sensing circuit 404 used in read for low power consumption.

Considering that the differential amplifier 450 and the sensing circuit 404 are stopped in a mode other than read, the best voltage applied to the selected memory cell at the time of read needs to be applied to the selected memory cell in a short time such as several ns when a read operation begins at the state other than read.

Since the configuration disclosed in Patent Literature 1 has generally a complicated circuit configuration of the differential amplifier 450, it takes several tens to several hundreds ns until the application voltage is stable. The configuration in which one of diffusion terminals of a transistor described as the sensing device 420 is fed back to the differential amplifier 450 is generally used in a power source circuit as disclosed in Patent Literature 2. In other words, the configuration disclosed in Patent Literature 1 is advantageous in stably providing constant voltage. However, in a discontinuous operation in which the circuit starts at a stopped state and sets a predetermined voltage, it is difficult for the circuit to perform the operation in a short time because of a delay in feedback due to the complexity of the circuit of the differential amplifier. Therefore, it is impossible to meet a demand for high-speed start in a setting voltage at the beginning of a read operation.

A cross-point variable resistance nonvolatile memory device according to a disclosed aspect is a cross-point variable resistance nonvolatile memory device comprising: a cross-point memory cell array including memory cells each including (i) a variable resistance element that reversibly changes at least between a low resistance state and a high resistance state when different voltages are applied to the variable resistance element and (ii) a current steering element that is connected in series with the variable resistance element and has nonlinear current-voltage characteristics, the memory cells being placed at respective cross-points of a plurality of bit lines and a plurality of word lines; a column decoder and pre-charge circuit which pre-charges a selected bit line to a first voltage in a first pre-charge period among the first pre-charge period, a second pre-charge period, and a sense period that are included in this order in a period of a read operation which determines whether a selected memory cell selected from the memory cells is in the low resistance state or the high resistance state, the selected bit line being one of the bit lines which is connected to at least the selected memory cell; a low decoder driver which pre-charges a selected word line to the first voltage in the first pre-charge period and the second pre-charge period, and which sets the selected word line to a third voltage in the sense period, the selected word line being one of the word lines which is connected to at least the selected memory cell, the third voltage being different from the first voltage; a feedback controlled bit line voltage clamp circuit which sets the selected bit line to a second voltage and maintains the second voltage in the second pre-charge period and the sense period; and a sense amplifier circuit which determines in the sense period, according to an amount of current flowing through the selected memory cell, whether the variable resistance element in the selected memory cell is in the low resistance state or the high resistance state.

Moreover, the feedback controlled bit line voltage clamp circuit may include: a first transistor having a source terminal connected to a reference voltage and having a gate terminal connected to the selected bit line; and a second transistor which provides and stops providing a current to the selected bit line according to a voltage of a drain terminal of the first transistor.

Moreover, the feedback controlled bit line voltage clamp circuit may include a first N-channel transistor, a second N-channel transistor, a P-channel transistor, and a switching element, a source terminal of the first N-channel transistor may be electrically connected to the selected memory cell, a gate terminal of the second N-channel transistor may be electrically connected to the selected memory cell, a gate terminal of the first N-channel transistor may be connected to a drain terminal of the second N-channel transistor, the drain terminal of the second N-channel transistor may be electrically connected to a drain terminal of the P-channel transistor, a source terminal of the P-channel transistor may be connected to a power source terminal, a source terminal of the second N-channel transistor may be connected to a reference voltage, a drain terminal of the first N-channel transistor may be connected to one of ends of the switching element, and the other of the ends of the switching element may be connected to the power source terminal.

Moreover, the switching element may electrically connect, in the second pre-charge period, the power source terminal and the drain terminal of the first N-channel transistor.

Moreover, the sense amplifier circuit may include a constant current element which outputs a constant current from an output terminal, and a differential sensing circuit which outputs a signal according to a comparison result of two input voltages that are an input voltage provided to a first input terminal and an input voltage provided to a second input terminal, the first input terminal of the differential sensing circuit may be connected to a determination reference voltage, and the output terminal of the constant current element may be connected to the second input terminal of the differential sensing circuit and the drain terminal of the first N-channel transistor.

Moreover, the constant current element may include a P-channel transistor having a source terminal and a well terminal which are connected to a power source voltage, and a drain terminal which is the output terminal.

Moreover, the low decoder driver may also pre-charge a word line other than the selected word line to the first voltage in the first pre-charge period.

Moreover, the column decoder and pre-charge circuit may also pre-charges a bit line other than the selected bit line to the first voltage in the first pre-charge period.

Moreover, the low decoder driver may put, in the sense period, an unselected word line into a high impedance state, the unselected word line being a word line other than the selected word line among the word lines, and the column decoder and pre-charge circuit may put, in the sense period, an unselected bit line into a high impedance state, the unselected bit line being a bit line other than the selected bit line among the bit lines.

Moreover, the column decoder and pre-charge circuit may put, in the second pre-charge period and the sense period, an unselected bit line into a high impedance state, the unselected bit line being a bit line other than the selected bit line among the bit lines.

With this configuration, in a cross-point memory cell, low power consumption is realized by stopping a read circuit in the case of other than read, and the best voltage linked to characteristics of the current steering element at the time of reading the selected memory cell is set and provided in short time. Furthermore, by performing pre-charge at the time of read in a two-stage pre-charge in which the overall memory cell array is pre-charged and then a selected bit line is pre-charged, it is possible to realized a more stable read operation in which a voltage shift is reduced.

A reading method in a disclosed aspect is a reading method for a cross-point variable resistance nonvolatile memory device, the cross-point variable resistance nonvolatile memory device including: a cross-point memory cell array including memory cells each including, at respective cross-points of a plurality of bit lines and a plurality of word lines; a column decoder and pre-charge circuit, (i) a variable resistance element that reversibly changes at least between a low resistance state and a high resistance state when different voltages are applied to the variable resistance element and (ii) a current steering element that is connected in series with the variable resistance element and has nonlinear current-voltage characteristics; a column decoder and pre-charge circuit; a low decoder driver; a feedback controlled bit line voltage clamp circuit; and a sense amplifier circuit, the method comprising: pre-charging a selected bit line to a first voltage in a first pre-charge period among the first pre-charge period, a second pre-charge period, and a sense period that are included in this order in a period of a read operation which determines whether a selected memory cell selected from the memory cells is in the low resistance state or the high resistance state, the selected bit line being one of the bit lines which is connected to at least the selected memory cell, the pre-charging being performed by the column decoder and pre-charge circuit; pre-charging a selected word line to the first voltage in the first pre-charge period and the second pre-charge period, and setting the selected word line to a third voltage in the sense period, the selected word line being one of the word lines which is connected to at least the selected memory cell, the third voltage being different from the first voltage, the pre-charging and setting being performed by the low decoder driver; setting the selected bit line to a second voltage, and maintaining the second voltage in the second pre-charge period and the sense period, the setting and maintaining being performed by the feedback controlled bit line voltage clamp circuit; and determining, in the sense period, according to an amount of current flowing through the selected memory cell, whether the variable resistance element in the selected memory cell is in the low resistance state or the high resistance state, the determining being performed by the sense amplifier circuit.

Moreover, the low decoder driver may also pre-charge, in the first pre-charge period, a word line other than the selected word line to the first voltage.

Moreover, the column decoder and pre-charge circuit may also pre-charge, in the first pre-charge period, a bit line other than the selected bit line to the first voltage.

Moreover, the low decoder driver may put, in the sense period, an unselected word line into a high impedance state, and the column decoder and pre-charge circuit put, in the sense period, an unselected bit line into a high impedance state, the unselected word line being a word line other than the selected word line among the word lines, the unselected bit line being is a bit line other than the selected bit line among the bit lines.

Moreover, the column decoder and pre-charge circuit may put, in the second pre-charge period and the sense period, an unselected bit line into a high impedance state, the unselected bit line being a bit line other than the selected bit line among the bit lines.

Moreover, the feedback controlled bit line voltage clamp circuit may include a transistor and a switching element, the selected bit line is electrically connected to a source terminal of the transistor, one of ends of the switching element is connected to a drain terminal of the transistor, and the other of the ends of the switching elements is connected to a power source, the transistor sets, in the second pre-charge period and the sense period, the selected bit line to the second voltage and maintains the second voltage with a voltage clamp operation, and the switching element is in an ON state only in the second pre-charge period.

Moreover, in the sense period, in the sense amplifier circuit, whether a variable resistance element in the selected memory cell is in a high resistance state or a low resistance state may be determined by comparison between (i) a voltage of the drain terminal of the transistor of the feedback controlled bit line voltage clamp circuit and (ii) a read determination reference voltage.

With this method, in a cross-point memory cell, low power consumption is realized by stopping a read circuit in the case of other than read, and the best voltage linked to characteristics of the current steering element at the time of reading the selected memory cell is set and provided in a short time. Furthermore, by performing pre-charge at the time of reading in a two-stage pre-charge in which the overall memory cell array is pre-charged and then a selected bit line is pre-charged, it is possible to realize a more stable read operation in which a voltage shift is reduced.

The following will describe embodiment of the present disclosure with reference to the drawings. It should be noted that there are cases where the substantially same or corresponding elements are provided with the same reference signs, and a description thereof will be omitted. Moreover, the embodiments to be described later are mere examples of the present disclosure. Numerical values, shapes, materials, structural elements, the arrangement and connection of the structural elements, steps, the processing order of the steps, and so on shown in the following embodiment are mere examples, and are not intended to limit the present disclosure. Moreover, among structural elements in the following embodiments, structural elements not recited in the independent claims representing the most generic concept are described as arbitrary structural elements.

[Basic Structure and Characteristics of Memory Cell According to Aspect of Present Disclosure]

First, the structure and characteristics of a memory cell comprised in a cross-point memory cell array will be described.

FIG. 1A is a diagram showing a three-dimensional structure of a single-layer cross-point memory cell array. Specifically, FIG. 1A shows memory cells 51, word lines (e.g., second layer wirings) 52 that are arranged in a direction (e.g., X direction) and in parallel with each other, and bit lines (e.g., first layer wirings) 53 that are arranged in a direction (e.g., y direction) and in parallel with each other so as to cross the word lines 52. Memory cells 51 exist each of which is placed at a different one of cross-points of the word lines 52 and the bit lines 53, and is between a corresponding one of the word lines 52 and a corresponding one of the bit lines 53.

Figure 1B:
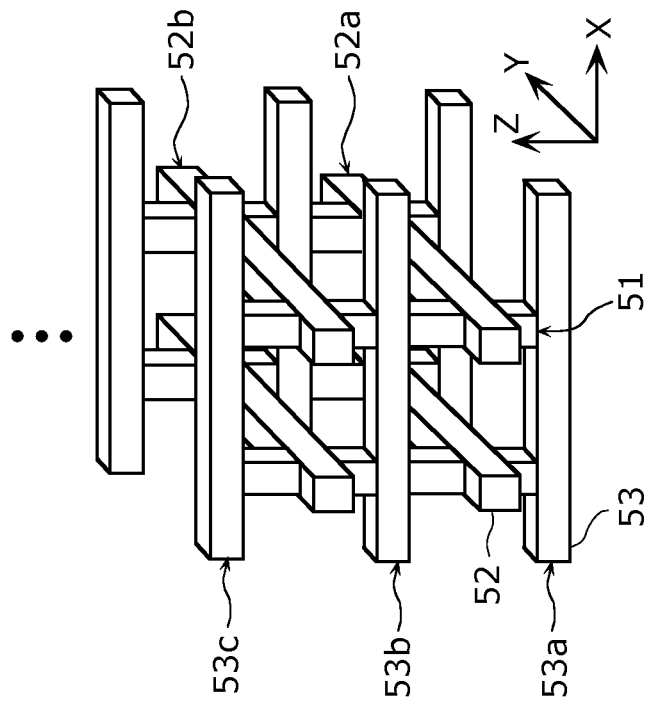
FIG. 1B is a diagram showing a three-dimensional structure showing an example of a multilayer cross-point memory cell array.

FIG. 1B is a three-dimensional structure of a multilayer cross-point memory cell array. Specifically, FIG. 1B shows a stack structure in multiple layers in which: bit lines 53 (first layer bit lines 53*a*) are placed in a first wiring layer; word lines 52 (first layer word lines 52*a*) are placed in a second wiring layer above the first wiring layer so as to cross the bit lines 53; bit lines 53 (second layer bit lines 53*b*) are placed in a third wiring layer above the second wiring layer so as cross the word lines 52; word lines 52 (second layer word lines 52b) are placed in a fourth wiring layer above the third wiring layer so as to cross the bit lines 53; and bit lines 53 (third layer bit lines 53c) are placed in a fifth wiring layer above the fourth wiring layer so as to cross the word lines 52. Each memory cell 51 is placed at a different one of cross-points of the word lines 52 and the bit lines 53 so as to be provided between a corresponding one of the word lines 52 and a corresponding one of the bit lines 53. Each memory cell 51 is placed at a different one of cross-points of the word lines 52 and the bit lines 53 so as to be provided between a corresponding one of the word lines 52 and a corresponding one of the bit lines 53.

As described above, the cross-point memory cell array has a simple structure in which memory cells are formed at cross-points of wires. Thus, a cross-point memory cell array achieves an increase in the number of memory cell areas per unit area without relying on a miniaturization process, by configuring a multilayer cross-point memory cell array by vertically stacking simple-layer cross-point memory cell arrays. Hence, the cross-point memory cell array is known as a structure suitable for high integration.

[Structure of Memory Cell]

Figure 2:
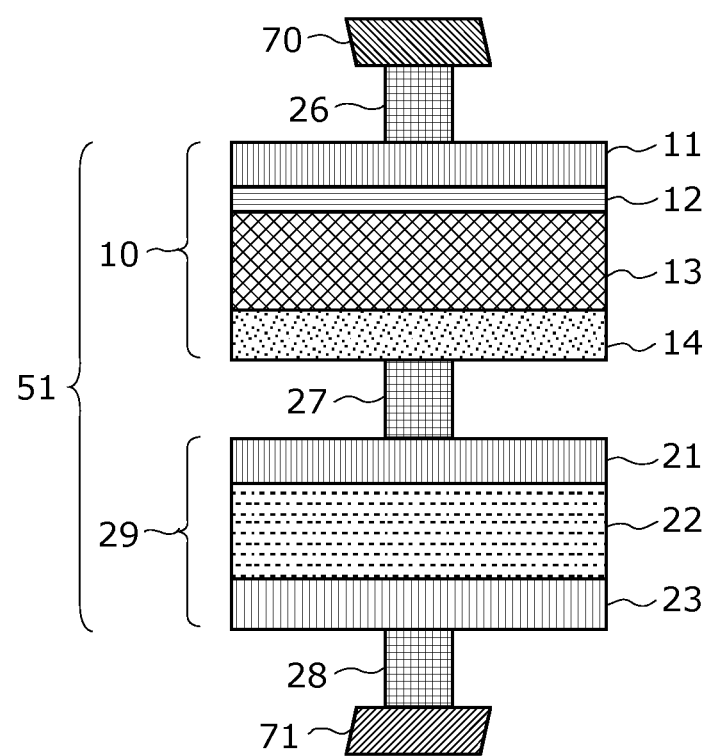
FIG. 2 is a cross-sectional view showing an example of a memory cell.

FIG. 2 is a diagram showing a cross-section of a memory cell 51 used for a cross-point memory cell array.

The memory cell 51 is a 1-bit memory cell including a variable resistance element 10 and a current steering element 29 that are connected in series with each other.

The variable resistance element 10 has the following structure. Oxygen-deficient tantalum oxide ($TaO_x$, $0<x<2.5$) is formed above a lower electrode 14 comprising, for instance, tantalum nitride (TaN), as a first variable resistance layer 13 (a first region comprising the variable resistance layer). An upper surface of the first variable resistance layer 13 is irradiated with oxygen plasma at 300° C. and 200 W for 20 seconds, thereby forming a thin second variable resistance layer 12 (a second metal oxide layer) comprising tantalum oxide ($TaO_y$, $x<y$). An upper electrode 11 comprising platinum (Pt) is formed on the second variable resistance layer 12.

The variable resistance layer is provided between the lower electrode 14 and the upper electrode 11, and is a layer which has a resistance value which reversibly changes based on an electrical signal provided to between the lower electrode 14 and the upper electrode 11. For example, the variable resistance layer is a layer which changes between a high resistance state and a low resistance state according to a polarity of a voltage applied to between the lower electrode 14 and the upper electrode 11. The variable resistance layer comprises by stacking at least two layers of a first variable resistance layer 13 connected to the lower electrode 14 and a second variable resistance layer 12 connected to the upper electrode 11.

The first variable resistance layer 13 comprises the first metal oxide that is oxygen deficient, and the second variable resistance layer 12 comprises the second metal oxide having a smaller degree of oxygen deficiency than that of the first metal oxide. In the second variable resistance layer 12 of the variable resistance element 10, a tiny localized region of which degree of oxygen deficiency reversibly changes due to the application of electrical pulse. The localized region is thought to contain a filament including an oxygen-deficient site.

The term "degree of oxygen deficiency" refers to a proportion of deficient oxygen to an amount of oxygen of an oxide having a stoichiometric composition (a stoichiometric composition having the highest resistance value when stoichiometric compositions are present) of a metal oxide. A metal oxide having a stoichiometric composition has a resistance value that is more stable and higher than those of metal oxides having other compositions.

For example, when a metal is tantalum (Ta), an oxide having a stoichiometric composition according to the above definition is $Ta_2O_5$, which can be expressed as $TaO_{2.5}$. A degree of oxygen deficiency of $TaO_{2.5}$ is 0%, and a degree of oxygen deficiency of $TaO_{1.5}$ is calculated as a degree of oxygen deficiency=$(2.5-1.5)/2.5$=40%. Moreover, an oxygen-excess metal oxide has a negative value of a degree of oxygen deficiency. It is to be noted that in the Description, unless otherwise specifically noted, the degree of oxygen deficiency includes a positive value, 0, and a negative value.

An oxide having a low degree of oxygen deficiency has a high resistance value because such an oxide is more similar to an oxide having a stoichiometric composition, and an oxide having a high degree of oxygen deficiency has a low resistance value because such an oxide is more similar to a metal included in an oxide.

The term "oxygen content atomic percentage" refers to a ratio of oxygen atoms to a total number of atoms. For instance, an oxygen content atomic percentage of $Ta_2O_5$ is calculated according to a ratio of oxygen atoms to a total number of atoms (O/(Ta+O)), that is, 71.4 atm %. Thus, an oxygen-deficient tantalum oxide has an oxygen content atomic percentage greater than 0 and less than 71.4 atm %. For example, when a metal comprised in the first metal oxide layer and a metal comprised in the second metal oxide layer are of the same type, an oxygen content atomic percentage has a correspondence relationship with a degree of oxygen deficiency. In other words, when the second metal oxide has an oxygen content atomic percentage greater than that of the first metal oxide, the second metal oxide has a degree of oxygen deficiency lower than that of the first metal oxide.

A variable resistance layer may comprise a metal other than tantalum. A transition metal or aluminum (Al) may be used as the metal comprised in the variable resistance layer. Tantalum (Ta), titanium (Ti), hafnium (Hf), zirconium (Zr), niobium (Nb), tungsten (W), nickel (Ni), or the like may be used as the transition metal. Since the transition metal can take a plurality of oxidation states, this can provide different resistance states by an oxidation-reduction reaction.

For instance, a resistance value of the variable resistance layer can be stably changed at high speed in the case where a tantalum oxide is used so that the first metal oxide has a composition expressed as $TaO_x$ and the second metal oxide has a composition expressed as $TaO_y$, where x is between 0.8 and 1.9 inclusive and y is larger than x in value. In this case, the second metal oxide may have a film thickness from 1 nm to 8 nm.

For instance, a resistance value of the variable resistance layer can be stably changed at high speed in the case where a hafnium oxide is used so that the first metal oxide has a composition expressed as $HfO_x$ and the second metal oxide has a composition expressed as $HfO_y$, where x is between 0.9 and 1.6 inclusive and y is larger than x in value. In this case, the second metal oxide may have a film thickness from 3 nm to 4 nm.

Moreover, a resistance value of the variable resistance layer can be stably changed at high speed in the case where a zirconium oxide is used so that the first metal oxide has a composition expressed as $ZrO_x$ and the second metal oxide has a composition expressed as $ZrO_y$ where x is between 0.9 and 1.4 inclusive and y is larger than x in value. In this case, the second metal oxide may have a film thickness from 1 nm to 5 nm.

A first metal comprised in the first metal oxide and a second metal comprised in the second metal oxide may be different in material from each other. In this case, the second metal oxide has a degree of oxygen deficiency lower than that of the first metal oxide, that is, may have a high resistance. With this configuration, a voltage applied between the lower electrode 14 and the upper electrode 11 when a resistance change occurs is divided more to the second metal oxide, which causes the oxidation-reduction reaction to easily occur in the second metal oxide.

Moreover, when the first metal comprised in the first metal oxide that is to be the first variable resistance layer and the second metal comprised in the second metal oxide that is to be the second variable resistance layer are different materials from each other, the second metal may have a standard electrode potential lower than that of the first metal. The standard electrode potential having a larger value represents a property of being more difficult to oxidize. Accordingly, the oxidation-reduction reaction is prone to occur in the second metal oxide having a relatively low standard electrode potential. Here, it is considered that in a resistance change phenomenon, the oxidation-reduction reaction in the tiny localized region formed in the second metal oxide having a high resistance changes the filament (conductive path), thereby changing a resistance value (a degree of oxygen deficiency) of the second metal oxide layer.

For instance, a stable resistance change operation is achieved by using an oxygen-deficient tantalum oxide ($TaO_x$) for the first metal oxide and a titanium oxide ($TiO_2$) for the second metal oxide. Titanium (with the standard electrode potential=−1.63 eV) is a material having a standard electrode potential lower than that of tantalum (with the standard electrode potential=−0.6 eV). As above, the oxidation-reduction reaction is more prone to occur in the second metal oxide when a metal oxide having a standard electrode potential lower than that of the first metal oxide is used for the second metal oxide. As another combination, an aluminum oxide ($Al_2O_3$) may be used for the second metal oxide layer that is to be a high resistance layer. For example, the oxygen-deficient tantalum oxide ($TaO_x$) may be used for the first metal oxide, and the aluminum oxide ($Al_2O_3$) may be used for the second metal oxide.

It is considered that in the resistance change phenomenon in a variable resistance layer having a stack structure, the oxidation-reduction reaction in the tiny localized region formed in the second metal oxide having a high resistance changes the filament (conductive path) in the localized region, thereby changing a resistance value of the second metal oxide.

To put it another way, when a positive voltage is applied to the upper electrode 11 connected to the second metal oxide with reference to the lower electrode 14, oxygen ions in the variable resistance layer are attracted toward the second metal oxide. With this, oxidation reaction occurs in the tiny localized region formed in the second metal oxide, and the degree of oxygen deficiency is reduced. As a result, it is considered that it becomes more difficult to maintain a connection to the filament in the localized region, and the resistance value increases.

In contrast, when a negative voltage is applied to the upper electrode 11 connected to the second metal oxide with reference to the lower electrode 14, the oxygen ions in the second metal oxide are thrust towards the first metal oxide. With this, reduction reaction occurs in the tiny localized region formed in the second metal oxide, and the degree of oxygen deficiency is increased. As a result, it is considered that it becomes easier to get a connection to the filament in the localized region, and the resistance value decreases.

The upper electrode 11 connected to the second metal oxide having a lower degree of oxygen deficiency comprises a material, such as platinum (Pt), iridium (Ir), or palladium (Pd), which has a standard electrode potential higher than that of the metal comprised in the second metal oxide and that of a material comprised in the lower electrode 14. Moreover, the lower electrode 14 connected to the first metal oxide having a higher degree of oxygen deficiency may comprise a material, such as tungsten (W), nickel (Ni), tantalum (Ta), titanium (Ti), aluminum (Al), tantalum nitride (TaN), or titanium nitride (TIN), which has a standard electrode potential higher than that of the metal comprised in the first metal oxide. The standard electrode potential having a larger value represents a property of being more difficult to oxidize.

In other words, a relationship of Vr2<V2 and V1<V2 may be satisfied between V2 that is the standard electrode potential of the second electrode, Vr2 that is the standard electrode potential of the metal comprised in the second metal oxide, Vr1 that is the standard electrode potential of the metal comprised in the first metal oxide, and V1 that is the standard electrode potential of the first electrode. Furthermore, a relationship of Vr1≥V1 may be satisfied with V2>Vr2.

With the above described configuration, the oxygen-reduction reaction is easy to selectively occur in the metal oxide adjacent to the interface between the upper electrode 11 and the second metal oxide, and stable characteristics of the variable resistance element 10 can be obtained.

The current steering element 29 is a diode element having nonlinear current-voltage characteristics in both positive and negative directions of an applied voltage, and is formed by, for instance, providing a current steering layer 22 comprising nitrogen-deficient silicon nitride between the lower electrode 23 and the upper electrode 21 that comprise tantalum nitride (TaN) or the like.

The bidirectional nonlinear current-voltage characteristics are such characteristics of the current steering element 29 that is in a high resistance (OFF) state in a predetermined voltage range where an applied voltage is a predetermined voltage and that is in a low resistance (ON) state in a range outside the predetermined voltage range (i.e., a voltage range higher or lower than the predetermined voltage range). That is, the current steering element 29 is in the high resistance (OFF) state when the applied voltage has an absolute value less than or equal to a predetermined value, and is in the low resistance (ON) state when the applied voltage has an absolute value greater than the predetermined value.

The memory cell 51 is a memory cell formed by connecting the variable resistance element 10 and the current steering element 29 in series by a via 27. The upper electrode 11 of the variable resistance element 10 is connected to an upper wire 70 (corresponding to one of a bit line 53 and a word line 52) by a via 26. Moreover, the lower electrode 23 of the current steering element 29 is connected to a lower wire 71 (corresponding to the other of the bit line 53 and the word line 52) by a via 28.

It is to be noted that, in FIG. 2, the current steering element 29 and the variable resistance element 10 may be vertically reversed with each other.

Moreover, in the memory cell 51, the via 27 may not be included. Moreover, one of the via 26 and the via 28, or both of the via 26 and the via 28 may not be included.

Figure 3:
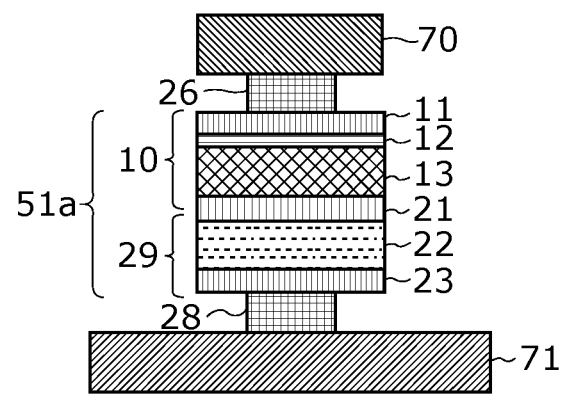
FIG. 3 is a cross-sectional view showing another example of a memory cell.

FIG. 3 is a diagram showing the cross-sectional structure of the memory cell 51a obtained through removing the via 27 from the memory cell 51 shown in FIG. 2.

The memory cell 52a, for example, comprises by stacking, in that order, a first electrode 23 comprising tantalum nitride (TaN), the current steering layer 22 comprising oxygen-deficient silicon nitride, a second electrode 21 comprising TaN, a first variable resistance layer 13 comprising oxygen-deficient tantalum oxide (TaO$_x$), a second variable resistance layer 12 comprising tantalum oxide (TaO$_y$, x<y) formed through oxidation of the first variable resistance layer 13 in an oxygen plasma atmosphere, and a third electrode 11 comprising platinum (Pt).

The lower wire 71 comprising aluminum (Al) is disposed in the lower layer of the memory cell 51a, and the lower wire 71 and the first electrode 23 of the memory cell 51a are connected to each other through the first via 28. The upper wire 70 comprising aluminum (Al) is disposed in the upper layer of the memory cell 51a, and the upper wire 70 and the third electrode 13 of the memory cell 51a are connected to each other through the third via 26. Moreover, the lower wire 71 and the upper wire 70 are disposed so as to cross each other.

In this structure, a current steering element 29 comprises the first electrode 23, the current steering layer 22, and the second electrode 21, and the variable resistance element 10 comprises the second electrode 21, the first variable resistance layer 13, the second variable resistance layer 12, and the third electrode 11. In other words, the memory cell 51a includes the variable resistance element 10 that reversibly changes at least between the low resistance state and the high resistance state due to application of voltages having different polarities, and the current steering element 29 that is connected in series to the second electrode 21 common to the variable resistance element 10.

Here, the second electrode 21 serves as the electrode each for the variable resistance element 10 and the current steering element 29. The second electrode 21 and the third electrode 11 shown in FIG. 3 correspond to the lower electrode 14 and the upper electrode 11, respectively, of the variable resistance element 10 that are described in FIG. 2. The descriptions about the lower electrode 14, the first variable resistance layer 13, the second variable resistance layer 12, and the upper electrode 11 of the variable resistance element 10 in FIG. 2 can be applied to those about the second electrode 21, the first variable resistance layer 13, the second variable resistance layer 12, and the third electrode 11 of the variable resistance element 10 in FIG. 3.

It should be noted that the variable resistance layer included in the variable resistance element 10 is not limited to a two-layer structure shown in FIGS. 2 and 3, and may be a single-layer structure or a multilayer structure having no less than three layers. A variable resistance element including at least the lower electrode, the variable resistance layer (having a single-layer structure or a stacked layer having no less than two layers), and the upper electrode can be used for a variable resistance element comprised in a cross-point variable resistance nonvolatile memory device.

Figure 4:
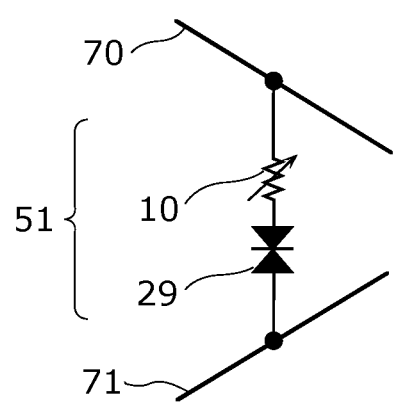
FIG. 4 is an equivalent circuit diagram showing an example of a memory cell.

FIG. 4 shows a circuit diagram showing connection between the variable resistance element 10 and the current steering element 29, that is, an equivalent circuit diagram of the memory cell 51.

[Characteristics of Memory Cell]

Figure 5:
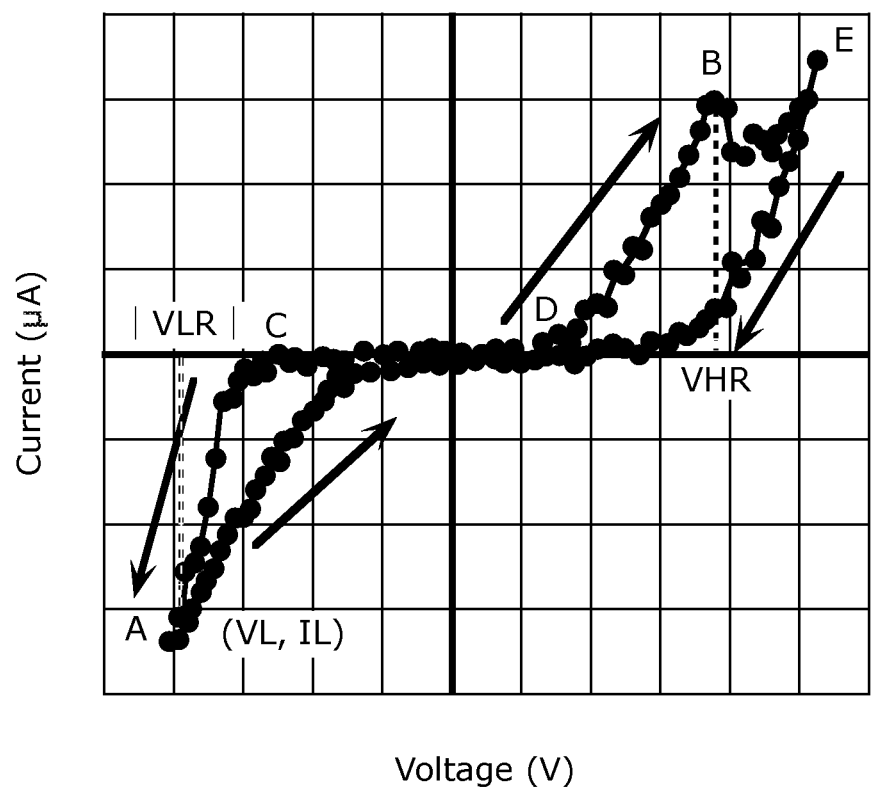
FIG. 5 is a graph showing an example of current-voltage characteristics of a memory cell.

An operation of the memory cell 51 will be described with reference to FIG. 5. FIG. 5 is a characteristic graph obtained by actually measuring a current-voltage relationship in the case of applying, to the memory cell 51 having the structure shown in FIG. 2, voltages whose polarity are assumed to be positive when the voltage at the upper wire 70 is higher than the voltage at the lower wire 71.

Suppose the memory cell 51 is initially in the high resistance state. When a voltage having negative polarity, with which the voltage at the lower wire 71 is higher than the voltage of the upper wire 71, is gradually increased and applied to the memory cell 51, starting from an applied voltage of 0 V, a current begins to flow at point C, and the variable resistance element starts to change from the high resistance state to the low resistance state. When the negative polarity voltage is further applied up to point A, the variable resistance element is rapidly changing to the low resistance state according to the applied voltage. Subsequently, the voltage is gradually decreased and applied until it reaches 0 V, while the variable resistance element is in the low resistance state. Point A is determined according to a value (here IL) of a current that flows through the variable resistance element when the variable resistance element changes to the low resistance state.

After this, when the positive-polarity voltage that causes the upper wire 70 to be higher in voltage than the lower wire 71 is gradually increased and applied to the memory cell 51, a current begins to flow at point D, and the variable resistance element 10 starts to change from the low resistance state to the high resistance state at point B where the voltage is substantially point-symmetrical to a voltage (point A) at which the low resistance state is reached. When the voltage is further applied up to point E, a current increase is observed. Subsequently, the current is lower when the applied voltage is decreased than when the applied voltage is increased, which indicates that the variable resistance element has changed to the high resistance state.

That is, the actual measurement data shown by FIG. 5 indicates, for the memory cell 51 having the structure shown by FIG. 2, (i) bidirectional resistance change characteristics of changing to the low resistance state when the voltage of the lower wire 71 is higher than or equal to a predetermined voltage VLth (point C) with respect to the voltage of the upper wire 70 and changing to the high resistance state when the voltage of the upper wire 70 is higher than or equal to a predetermined voltage VHth (point B) with respect to the voltage of the lower wire 71, and (ii) a current-voltage relationship in which the applied voltage in the low resistance state (point A) and the voltage at which the change to the high resistance state starts (point B) are substantially symmetrical. Thus, it is required that the variable resistance element 10 is driven with a current greater than or substantially equal to a high resistance writing voltage or a low resistance writing voltage. In practice, for example, an absolute value of the high resistance writing voltage is greater than an absolute value of the low resistance writing voltage.

Moreover, when the variable resistance element 10 of the memory cell 51 is changed from the high resistance state to the low resistance state, a resistance value of the low resistance state changes to a low resistance value (point A) corresponding to a value of a current flowing through the variable resistance element 10, by applying, to the memory cell 51, a predetermined voltage (an absolute value being a voltage higher than or equal to VLth) that causes a resistance change in the variable resistance element 10.

In other words, for a stable resistance change operation, low resistance writing needs to be performed by controlling (limiting) a current to a predetermined current value to thereby attain a predetermined low resistance state, whereas high resistance writing needs to be performed by applying a voltage in an opposite polarity to that in the low resistance writing and causing a higher voltage and a larger current than in the low resistance writing.

It should be noted that in FIG. 5, a voltage section from 0 V to point C in the low resistance writing (i.e., the high resistance state) and a voltage section from 0 V to point D in the high resistance writing (i.e., the low resistance state) are a voltage range in which there is no noticeable current flow even when a voltage is applied to the memory cell 51.

Point C and point D in FIG. 5 each corresponds to a total voltage of a threshold voltage (hereafter denoted as VF) of the current steering element 29 and a resistance change voltage of the variable resistance element 10. Preferably, an operation of reading or writing a cross-point memory cell array is performed by applying a voltage larger than or equal to this total voltage to a selected cell while causing an operating point to be between point C and point D for an unselected memory cell, to reduce a leakage current to the unselected memory cell.

[Cross-Point Memory Cell Array and Array Equivalent Circuit]

The following describes an array equivalent circuit of a cross-point memory cell array.

Figure 6:
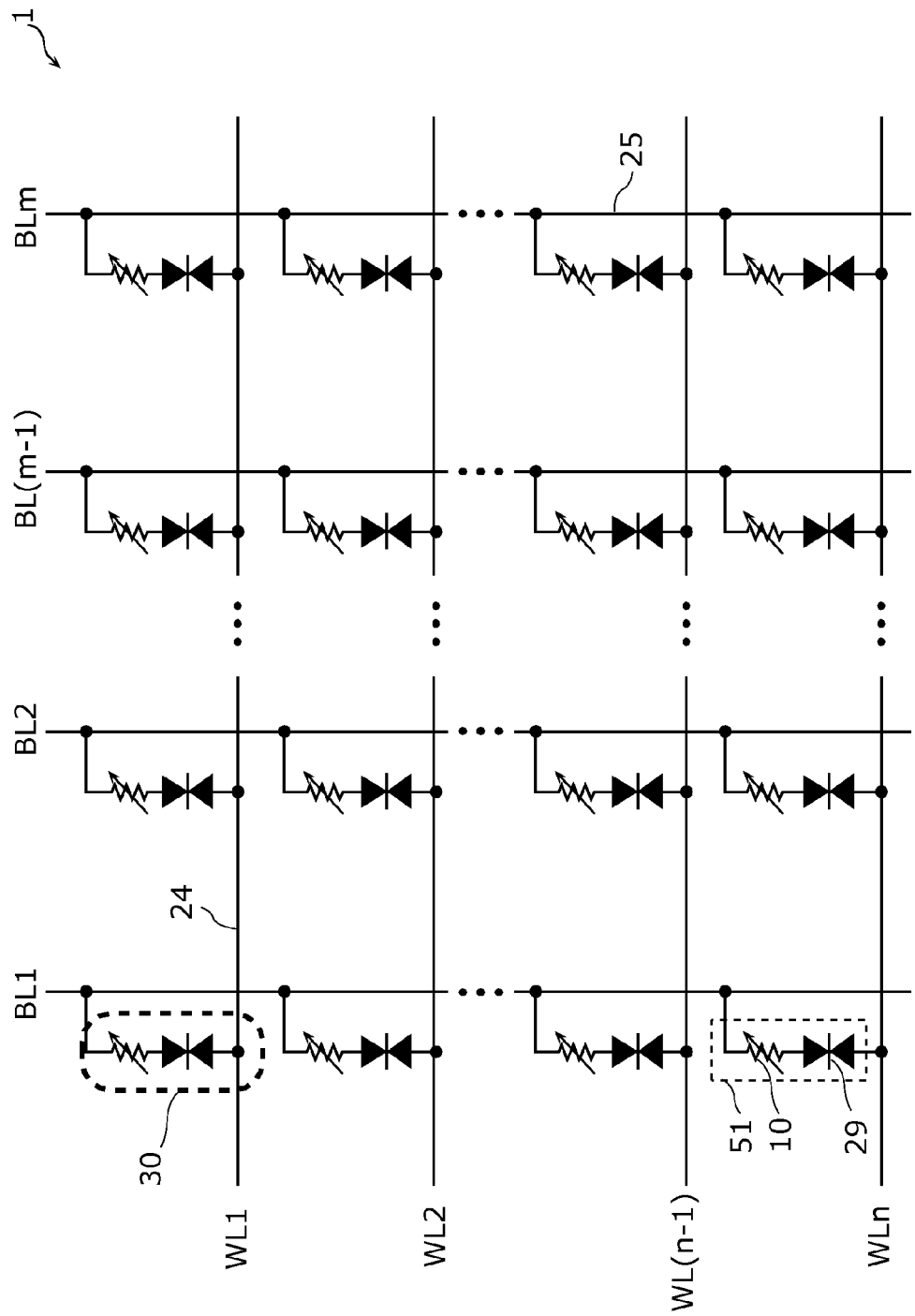
FIG. 6 is a cross-sectional view showing a memory cell array in which memory cells are disposed in matrix.

FIG. 6 shows a configuration diagram of a memory cell array in which memory cells 51 are disposed in a matrix.

In FIG. 6, each word line 24 indicates a line formed by placing an n number of wires WL1 to WLn in parallel with each other, and each bit line 25 indicates a bit line that is formed by placing an m number of wires BL1 to BLm in parallel with each other and crosses the word line in a non-contact manner (three-dimensionally). Each memory cell 51 in which the variable resistance element 10 and the current steering element 29 are connected in series is placed at a different one of cross-points of the word lines 24 and the bit lines 25. The variable resistance element 10 has one end connected to a corresponding one of the bit lines 25, and the current steering element 29 has one end connected to a corresponding one of the word lines 24. To put it another way, a memory cell array 1 shown in FIG. 6 includes n memory cells 51 arranged in a direction of each bit line 25 and m memory cells 51 arranged in a direction of each word line 24, that is, n×m memory cells 51.

[Structure of Dummy Memory Cell Using Fixed Resistance Element]

Figure 7:
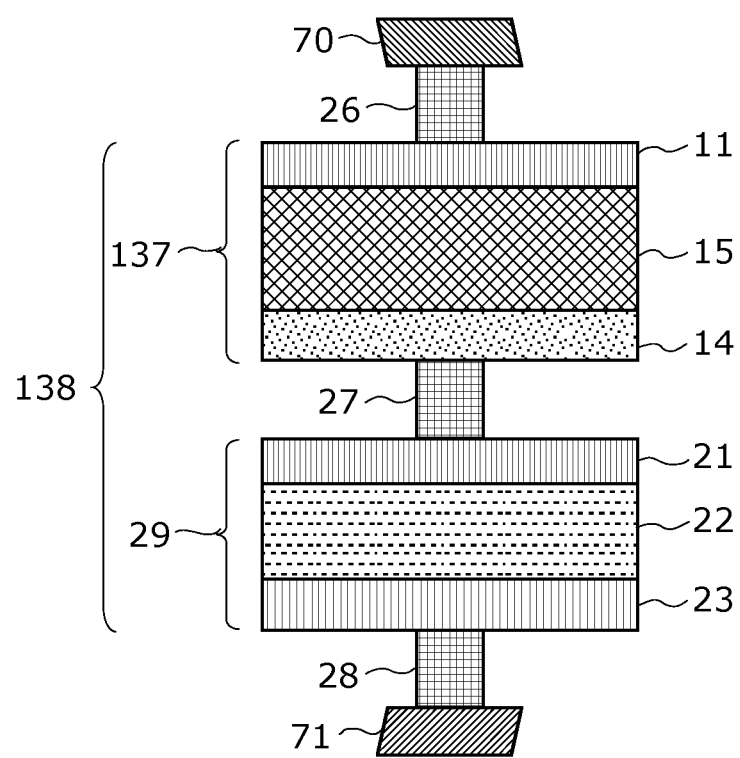
FIG. 7 is a cross-sectional view showing an example of a dummy memory cell.

A dummy memory cell will be described as a preparation for describing the cross-point variable resistance nonvolatile memory device. The dummy memory cell is comprised in a fixed resistance element, and is used in a standard voltage generation circuit included in the cross-point variable resistance nonvolatile memory device. FIG. 7 shows a cross-sectional configuration diagram of the dummy memory cell.

In FIG. 7, the dummy memory cell 138 includes a configuration in which a fixed resistance element 137 and the current steering element 29 are connected in series to each other.

The fixed resistance element 137, for example, has a structure formed by stacking oxygen-deficient tantalum oxide (TaO$_x$, 0≤x≤2.5) above a lower electrode 14 comprising tantalum nitride (TaN) as a resistance layer 15 (a region comprising the resistance layer), and an upper electrode 11 comprising platinum (Pt) in this order. By controlling the oxygen content in the resistance layer 15 at the time of manufacturing, the resistance of the fixed resistance element 137 can be set to a predetermined value. The resistance value of the fixed resistance element 137 may be set to almost equal to the resistance value in the low resistance state or the high resistance state of the variable resistance element 10 shown in FIG. 2.

Since the current steering element 29 is the same as that in FIG. 2, a detailed description thereof will be omitted.

The dummy memory cell 138 is a memory cell in which the fixed resistance element 137 and the current steering element 29 are connected in series using the via 27. The upper electrode 11 of the fixed resistance element 11 and the upper wire 70 are connected to each other by the via 26, and the lower electrode 29 of the current steering element 29 and the lower wire 71 are connected to each other by the via 28.

It is to be noted that, in FIG. 7, the current steering element 29 and the fixed resistance element 137 may be vertically reversed with each other.

Moreover, in the dummy memory cell 138, the via 27 may not be included. Moreover, one of the via 26 and the via 28, or both of the via 26 and the via 28 may not be included.

Figure 8:
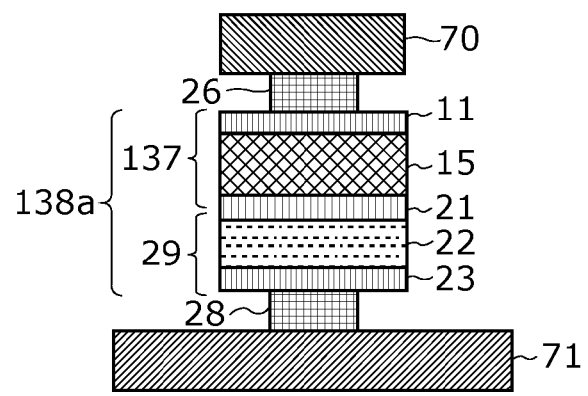
FIG. 8 is a cross-sectional view showing another example of a dummy memory cell.

FIG. 8 is a diagram showing the cross-sectional structure of a dummy memory cell 138a obtained through removing the via 27 from the dummy memory cell 138 shown in FIG. 7.

The dummy memory cell 138a, for example, comprises by stacking, in that order, a first electrode 23 comprising tantalum nitride (TaN), a current steering layer 22 comprising oxygen-deficient silicon nitride, a second electrode 21 comprising TaN, a resistance layer 15 comprising oxygen-deficient tantalum oxide (TaO$_x$), and a third electrode 11 comprising platinum (Pt). The lower wire 71 comprising aluminum (Al) is disposed in the lower layer of the dummy memory cell 138a, and the lower wire 71 and the first electrode 23 of the dummy memory cell 138a are connected to each other by the first via 28. The upper wire 70 comprising aluminum (Al) is disposed in the upper layer of the dummy memory cell 138a, and the upper wire 70 and the third electrode 13 of the memory cell 138a are connected to each other by the third via 26.

In this structure, the current steering element 29 comprises the first electrode 23, the current steering layer 22, and the second electrode 21. The fixed resistance element 137 comprises the second electrode 21, the resistance layer 15, and the third electrode 11. In other words, the dummy memory cell 138a includes a fixed resistance element 137, and a current steering element 29 that is connected in series with the second electrode common to the fixed resistance element 29.

Here, the second electrode 21 serves as one of the electrodes of the fixed resistance element 137 and one of the electrodes of the current steering element 29.

Moreover, a transition metal other than tantalum may be used as a transition metal comprised in the resistance layer 15. For example, tantalum (Ta), titanium (Ti), hafnium (Hf), zirconium (Zr), niobium (Nb), tungsten (W), or the like may be used as a transition metal. Since the transition metal can take a plurality of oxidation states, this can provide different resistance states.

Figure 9:
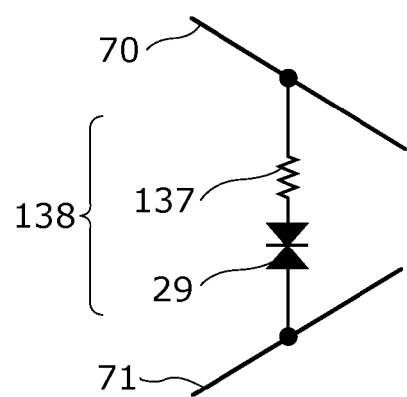
FIG. 9 is an equivalent circuit diagram showing an example of a dummy memory cell.

FIG. 9 shows a circuit diagram showing connection between the fixed resistance element 137 and the current steering element 29, that is, an equivalent circuit diagram of the dummy memory cell 138.

[Cross-Point Variable Resistance Nonvolatile Memory Device]

Figure 10:
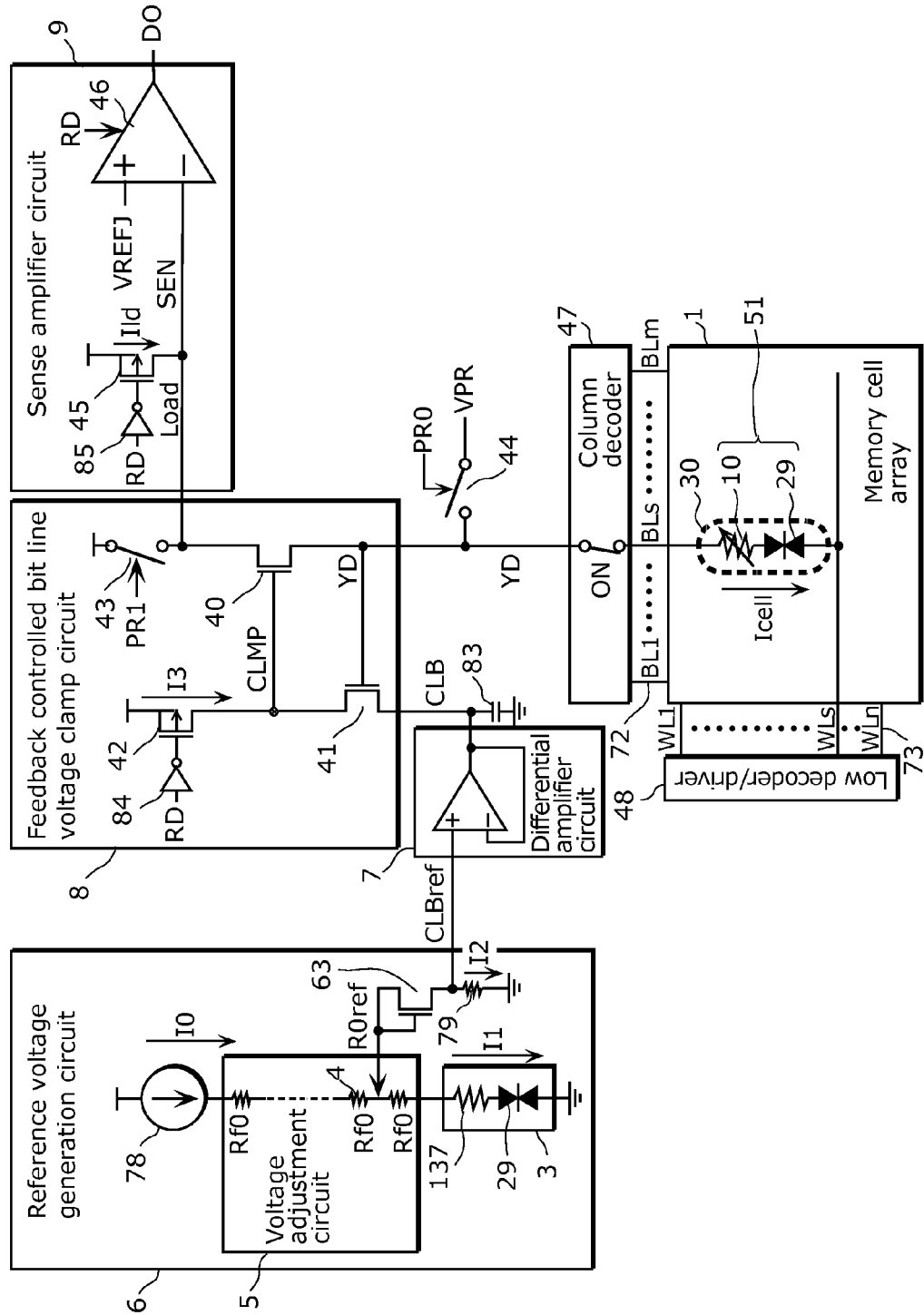
FIG. 10 is a circuit block diagram showing an example of a read circuit according to Embodiment.

FIG. 10 is a circuit configuration diagram of a read circuit included in a cross-point variable resistance nonvolatile memory device according to Embodiment. The read circuit rapidly increases a read voltage of the memory cell in conjunction with a threshold of the current steering element 29. In FIG. 10, the same reference marks will be assigned to the structural elements that are the same as those as described above, and a description thereof will be omitted. It should be noted that the current steering element 29 of the reference memory cell 3 in the reference voltage generation circuit 6 is formed in the same manufacturing process as that of the current steering element 29 of the memory cell 51 in the memory cell array 1.

In FIG. 10, a low decoder/driver 48 applies a predetermined voltage to a selected one of the word lines WL1 to WLn in the memory cell array 1, and a column decoder 47 selects a predetermined one of the bit lines BL1 to BLn in the memory cell array 1. A memory cell disposed in a cross-point of (i) the word line WLs selected by the low decoder/driver 48 and (ii) the bit line BLs selected by the column decoder 47 is selected from among memory cells 51 disposed in the memory cell array 1 as the selected memory cell 30.

The fixed resistance element 137 has a predetermined resistance value (e.g., a value almost equal to that of the variable resistance element 10 in the high resistance state), and the reference memory cell 3 is configured such that the fixed resistance element 137 and the current steering element 29 are connected in series to each other.

The fixed resistance element 4 comprises polysilicon or the like, and a voltage adjustment circuit 5 is configured by connecting, in series, a plurality of the fixed resistance elements 4.

Between a power source terminal and a ground terminal, a current source 78, the voltage adjustment circuit 5, and the reference memory cell 3 are connected in series in this order.

The fixed resistance element 79 has a predetermined resistance value (e.g., a resistance value which limits the amount of current to no more than 1 pA). An N-channel transistor 63 functions as a diode by connecting between a drain terminal and a gate terminal. Any selected one of terminals of the voltage adjustment circuit 5 in which the fixed resistance elements 4 are connected in series and a drain electrode of the N-channel transistor 63 are connected to each other. A source electrode of the N-channel transistor 63 and the first end of the fixed resistance element 79 are connected to each other. The second terminal of the fixed resistance element 79 is connected to the ground terminal.

The reference voltage generation circuit 6 includes a current source 78, a voltage adjustment circuit 5, a reference memory cell 3, an N-channel transistor 63, and a fixed resistance element 79. The source electrode of the N-channel transistor 63 is connected to a node CLBref as an output terminal of the reference voltage generation circuit 6.

A differential amplifier circuit 7 functions as a feedback amplifier circuit by connection between an inverting input terminal and an output terminal. A non-inverting input terminal of the differential amplifier circuit 7 is connected to the node CLBref. By performing current amplification on the voltage of the output node CLBref, the differential amplifier circuit 7 outputs a voltage equal to that of the node CLBref to the node CLB.

A smoothing capacitor 83 reduces a change in instantaneous voltage of the node CLB.

A source electrode of a P-channel transistor 42 is connected to a power source, and a gate electrode is connected to an output of an inverter 84, and a drain electrode is connected to a drain terminal (node CLMP) of the N-channel transistor 41. The source electrode 41 of the N-channel transistor 41 is connected to the node CLB, and the gate electrode of the N-channel transistor 41 is connected to a node YD. The node YD is connected to the column decoder 47.

A signal RD is provided to the inverter 84. When the signal RD is 'L' via the inverter 84, the P-channel transistor 42 is OFF. When the signal RD is 'H', the P-channel transistor 42 is OFF. Here, 'L' and 'H' each show a voltage, level of signal. Hereinafter, the voltage level of signal will be described in such a manner.

The drain terminal of the N-channel transistor 40 is connected to a node SEN, the gate electrode is connected to the node CLMP, and the source electrode is connected to the node YD.

The first terminal of the switching element 43 is connected to the drain electrode of the N-channel transistor 40. The second terminal of the switching element 43 is connected to a power source terminal. Conduction and non-conduction between the first terminal and the second terminal of the switching element 43 is controlled by a signal PR1. When the signal PR1 is 'L', the switching element 43 is OFF (non-conduction). When the signal PR1 is 'H', the switching element 43 is ON (conduction).

A feedback connection is made between the N-channel transistor 40 and the N-channel transistor 41 via the node YD and the node CLMP.

The feedback controlled bit line voltage clamp circuit 8 comprises the N-channel transistor 40, the N-channel transistor 41, the switching element 43, and the inverter 84.

The first terminal of the switching element 44 is connected to a terminal VPR which provides a pre-charged voltage, and the second terminal of the switching element 44 is connected to the node YD. Conduction and non-conduction between the first terminal and the second terminal of the switching element 44 is controlled by a signal PR0. When the signal PR0 is 'L', the switching element 44 is OFF (non-conduction). When the signal PR0 is 'H', the switching element 44 is ON (conduction).

In the differential sensing circuit 46, a determination reference voltage VREFJ is applied to a non-inverting input terminal, and the non-inverting input terminal is connected to the node SEN. When the voltage of the node SEN is higher than the determination reference voltage VREFJ, the differential sensing circuit 46 outputs a signal DO that is 'L'. When the voltage of the node SEN is lower than the determination reference voltage VREFJ, the differential sensing circuit 46 outputs a signal DO that is 'H'. In the P-channel transistor 45, the source terminal and the well terminal are connected to a power source, the gate terminal is connected to the output terminal of the inverter 85, and the drain terminal is connected to the node SEN.

The sense amplifier circuit 9 comprises the P-channel transistor 45 and the differential sensing circuit 46.

Next, a read operation by the read circuit shown in FIG. 10 will be described.

For example, a word line WLs is selected by the low decoder/driver 48. The selected word line WLs is, for example, set to 0 V, and the unselected word line is set to a high impedance (hereinafter denoted as Hi-z) state. A predetermined bit line BLs is selected by the column decoder 47. The selected bit line BLs is connected to the node YD, and the unselected bit line is set to the Hi-z state.

As described above, in the memory cell array 1, by selecting a predetermined bit line and a predetermined word line, the selected memory cell 30 is selected, 0 V is applied to the first end of the selected memory cell 30 via the word line WLs, and the second end of the selected memory cell 30 is connected to the node YD via the bit line BLs.

In the reference voltage generation circuit 6, current I0 for reading the memory cell flows from the power source 78. The current I0 is divided to the current I1 flowing through the reference memory cell 3 and the current I2 flowing through the fixed resistance element 79. Here, the current I2 is much smaller than the current I0, and I0≈I1 can be regarded.

An output voltage of the voltage adjustment circuit 5 is determined according to characteristics of the reference memory cell 3 and the selection of connection point by the voltage adjustment circuit 5. The output voltage of the voltage adjustment circuit 5 is applied to the node R0ref. A voltage which drops from the voltage of the node R0ref by a threshold voltage Vt appears in the node CLBref.

In other words, when the voltage of the node is expressed as V (the name of the node), V (CLBref)=V (R0ref)−Vt. It should be noted that the same notation method for the node voltage is used hereafter.

With this operation, the reference voltage generation circuit 6 generates, by the reference memory cell 3, a read voltage of the memory cell 51 in the memory cell array 1.

Current amplification is performed on the voltage V of the node (CLBref) by the differential amplifier circuit 7 without changing the voltage value, and the voltage V is reliably applied to the node CLB on a steady basis.

In other words, V (CLB)=V (CLBref)>0V.

In the feedback controlled bit line voltage clamp circuit 8, because of RD='H', the P-channel transistor 42 is ON, and a predetermined current I3 is caused to flow. When the switching element 43 is ON, a voltage is applied to the node SEN.

When the voltage of the node YD is increased, the N-channel transistor 41 is ON in the case where the voltage between the source terminal (node CLB) and the gate terminal (node YD) of the N-channel transistor 41 exceeds the threshold voltage Vt of the N-channel transistor 41. The voltage of the node CLMP drops from the voltage near the power source voltage. When the voltage between the source terminal (node YD) and the gate terminal (node CLMP) of the N-channel transistor 40 is near the threshold voltage Vt of the N-channel transistor 40, the voltage of the node CLMP is stable.

In other words, the voltage of the node YD and the voltage of the node CLMP, with reference to the voltage of the node CLB, by mutually performing feedback control automatically and at a high speed, are stable at the voltage of V (YD)=V (CLB)+Vt, V (YD)=V (CLMP)−Vt, respectively.

With this feedback control, the voltage of the node YD, when read starts, quickly increases from a voltage that is insufficient for read and that has been set so far to the read voltage.

With the operation, the voltage of the node YD at the time of read is determined by the following relationship. A read current I0 flows through the reference memory cell 3 that is equivalent to the memory cell 51, and a read voltage is generated in the reference memory cell 3. Through fine-tuning by the voltage adjustment circuit 5, a reference voltage equal to the voltage to be applied to the node YD is generated in the node R0ref. A voltage which drops from the voltage of the node R0ref by the threshold voltage Vt of the N-channel transistor 63 is generated in the node CLBref.

The voltage of the node CLBref is copied to the node CLB by the differential amplifier circuit 7 (V (CLB)=V (CLBref)). The voltage which increases from the voltage of the node CLB by the threshold voltage Vt of the N-channel transistor 41 is set to the node YD.

The capacitance of the node CLMP as a load is substantially small because the elements connected to the node CLMP are only three transistors. Furthermore, the voltage of the node YD is effectively controlled only by the N-channel transistors 40 and 41 in the feedback controlled bit line voltage clamp circuit 8. Therefore, it is found that the feedback control of the voltage of the node CLMP with respect to a voltage change of the node YD can be performed at a very high speed.

After a very short time for setting the read voltage to the node YD, the switching element 43 changes to the OFF state. At this time, RD='H' still remains and the P-channel transistor 45 is in the ON state.

The voltage of the node SEN is determined according to a magnitude relationship between a load current Ild and a current Icell of the selected memory cell 30. The load current Ild, in a state where a read voltage is applied to the selected memory cell 30, is set to a current having a middle amount between the amount of the current which flows when the selected memory cell 30 is in the HR state and the amount of the current which flows when the selected memory cell 30 in the LR state.

The differential sensing circuit 46 determines whether or not the voltage of the node SEN is greater than the determination reference voltage VREFJ, and then outputs a signal DO showing the determination result. For example, V (SEN)>VREFJ means DO='L', and V (SEN)<VREFJ means DO='H'.

In this way, a read voltage is quickly set for the selected memory cell 30, and it is possible to perform read determination in a short time.

In the above described operation, an effect of applying a predetermined positive voltage to the node CLB is described as follows.

For comparison, when the voltage of the node CLB is set to 0V, the voltage of the node YD is approximately the threshold voltage Vt of the N-channel transistor 41. Since the voltage of the node YD is lower than the voltage necessary for read of the selected memory cell 30, the current steering element 29 is cut off and it is impossible to read.

In order to avoid this, it is considered that the voltage of the node CLMP is increased by adjusting a current driving capability for each of the P-channel transistor 42 and the N-channel transistor 41. In this case, however, since the stability of the voltage of the node CLMP is degraded and ringing occurs at the node YD, the stabilization time is lengthened or oscillates.

In other words, the feedback control of the node CLMP for the node YD requires a current driving capability of the N-channel transistor 42 that is larger than that of the P-channel transistor 42, and the application of a predetermined positive voltage to the source terminal of the N-channel transistor 41 is important for the high speed and stabilization of the read operation.

Moreover, an effect of using the reference memory cell 3 in the reference voltage generation circuit will be described as follows.

By using the reference memory cell 3 in the reference voltage generation circuit 6, even when characteristics of the current steering element 29 and the transistor are changed due to variation in the manufacturing process and a change in temperatures, the variation can be automatically reflected in the reference voltage V (CLBref). Therefore, at the time of read, it is possible to stably apply the best voltage for reading the selected memory cell on the node YD (selected bit line) by automatic adjustment on a steady basis. In other words, stable read is possible on a steady basis.

[Configuration Using Variable Resistance Element in Reference Memory Cell]

Figure 11:
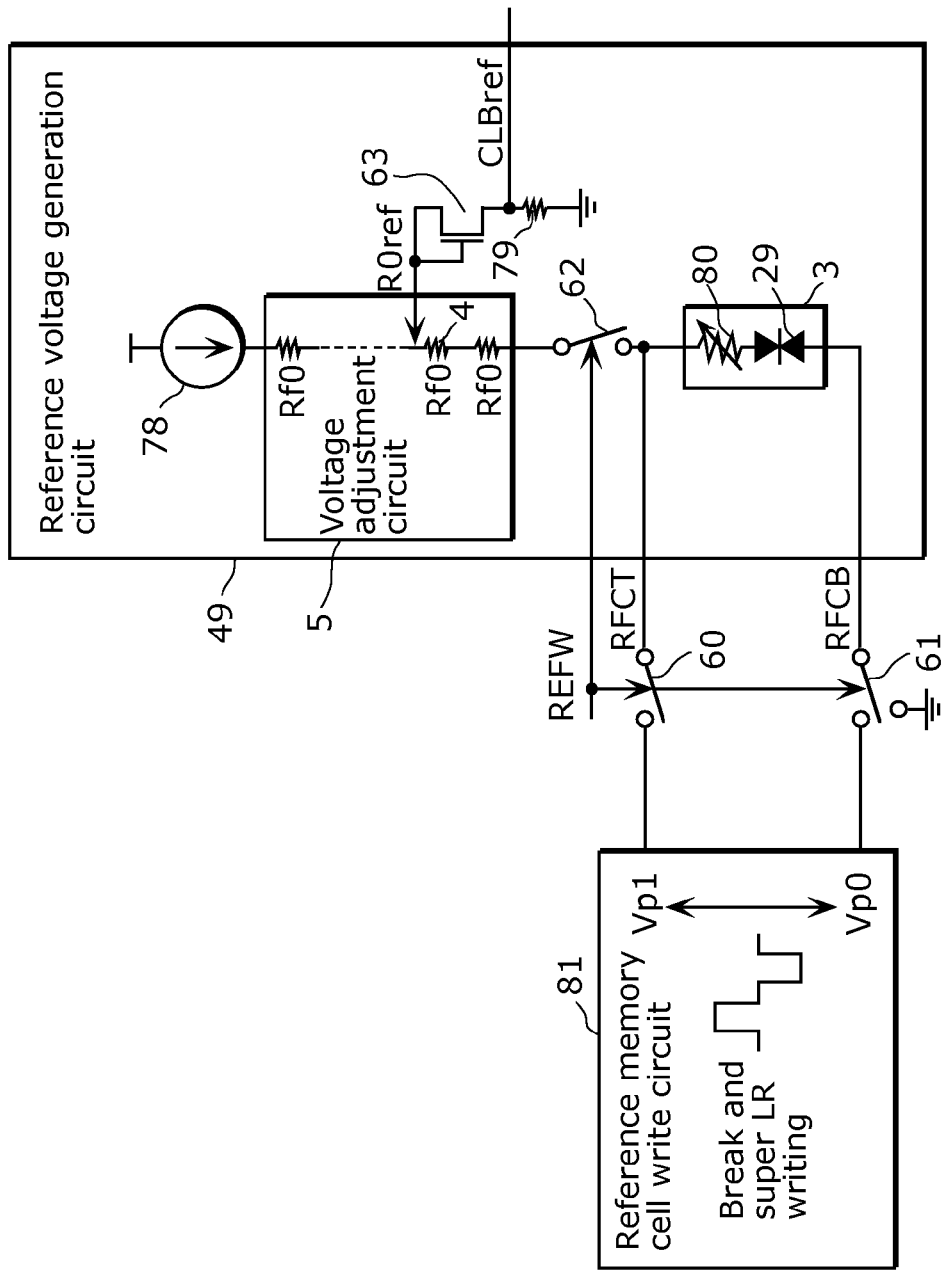
FIG. 11 is a block diagram showing an example of a reference voltage generation circuit including a write circuit according to Embodiment.

As a variable resistance element included in the reference memory cell 3 used in the reference voltage generation circuit 6, it is possible to use a variable resistance element having the same structure as that of a variable resistance element included in the memory cell 51. In that case, a write circuit is provided to set to a predetermined resistance value of the variable resistance element included in the reference memory cell 3 (a state almost similar to that in which the memory cell 51 is set to a high resistance value). FIG. 11 shows a configuration of the reference voltage generation circuit including the read circuit.

In FIG. 11, the same reference marks will be assigned to the structural elements that are the same as those as described above, and a description thereof will be omitted.

In the reference voltage generation circuit 49 in FIG. 11, a variable resistance element 80 is included in the reference memory cell 3 and has the same configuration as that of the variable resistance element 10.

In a switching element 62, the first terminal is connected to the voltage adjustment circuit 5, and the second terminal is connected to the first terminal of the switching element 60. In the switching element 62, conduction and non-conduction between the first terminal and the second terminal is controlled by the switching control signal REFW. The switching element 62 is controlled to be the ON (conduction) state at the time of read, and the switching element 62 is controlled to be the OFF (non-conduction) state at the time of write of the variable resistance element 80.

A reference memory cell write circuit 81 generates a voltage for writing the reference memory cell 3 between the first terminal Vp1 and the second terminal Vp0.

The switching elements 60 and 61, at the time of write of the variable resistance element 80, connect the output terminals Vp0 and Vp1 of the reference memory cell write circuit 81 to the first terminal and the second terminal, respectively, of the reference memory cell 3.

In the switching element 60, the first terminal is connected to the first terminal of the reference memory cell 3, and the second terminal is connected to the first terminal Vp1 of the reference memory cell write circuit 81. The switching element 60 is, at the time of read, in the OFF (non-conduction) state according to the switching control signal REFW. The switching element 60 is in the ON (conduction) state at the time of write of the variable resistance element 80, and connects the first terminal of the reference memory cell 3 to the first terminal Vp1 of the reference memory cell write circuit 81.

In the switching element 61, the first terminal is connected to the second terminal of the reference memory cell 3, and the second terminal is connected to the second terminal Vp0 of the reference memory cell write circuit 81. The switching element 61 connects, at the time of read, the second terminal of the reference memory cell 3 to a ground (VSS) according to the switching control signal REFW. The switching element 60 connects, at the time of write, the second terminal of the reference memory cell 3 to the second terminal Vp0 of the reference memory cell write circuit 81.

Next, a write operation on the variable resistance element 80 in FIG. 11 will be described with reference to a sequence diagram in FIG. 12.

Figure 12:
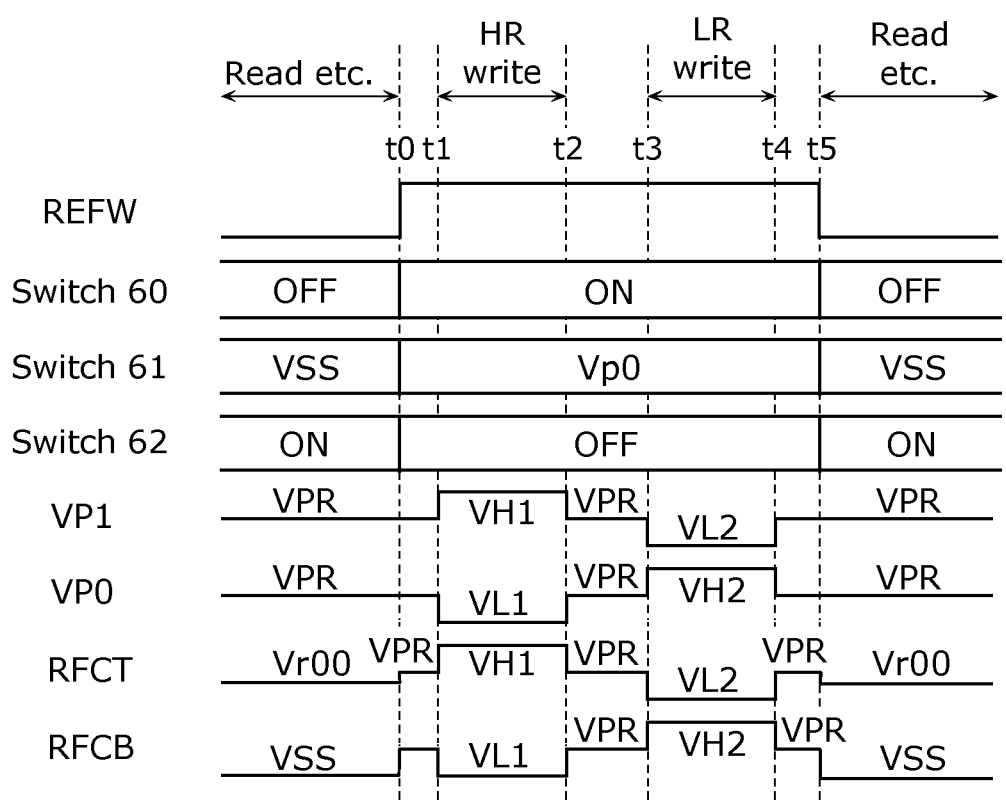
FIG. 12 is a sequence diagram showing an example of an operation of a reference voltage generation circuit including a write circuit according to Embodiment.

The sequence in FIG. 12 shows an example of the sequence in which HR writing and LR writing on the variable resistance element 80 from the state other than write (e.g., read and standby state) are performed, and which returns to the state other than write again.

In FIG. 12, the first is in a standby or read state. Therefore, the switching control signal REFW='L', the switching element 60 is in the OFF state, the switching element 61 is the VSS selection state, and the switching element 62 is in the ON state. The node RFCT is connected to the voltage adjustment circuit 5, is a voltage level (e.g, Vr00) determined according to the flowing current by the read current source 78, and the node RFCB is a ground level (VSS). At this time, a pre-charge voltage VPR is outputted to the output terminals Vp0 and Vp1 of the reference memory cell write circuit 81.

At time t0, on starting of the write sequence, the switching control signal REFW=the switching element 60 is in the ON state, the switching element 61 is in the Vp0 selection state, and the switching element 62 is in the OFF state. The node RFCT is a voltage of the output terminal Vp1, that is, a pre-charge voltage VPR, and the node RFCB is a voltage of the node Vp0, that is, a pre-charge voltage VPR.

At time t1, the HR write pulse is outputted from the reference memory cell write circuit 81. For example, as the HR write pulse, the voltage VL1 is outputted to the output terminal Vp0, and the voltage VH1 (VH1>VL1) is outputted to the output terminal Vp1. The voltage of the node RFCT changes from VPR to VH1, and the voltage of the node RFCB changes from VPR to VL1. Between time t1 and time t2, the variable resistance element 80 in the reference memory cell 3 changes to a predetermined HR state.

At time t2, the voltages of the output terminals Vp0 and Vp1 of the reference memory cell write circuit 81 both return to a pre-charge voltage VPR, the node RFCT and the node RFCB are both set to the voltage VPR again.

Next, at time t3, the LR write pulse is outputted from the reference memory cell write circuit 81. For example, the voltage VH2 is outputted to the output terminal Vp0, and the voltage VL2 (VH2>VL2) is outputted to the output terminal Vp1. The voltage of the node RFCT changes from VPR to VL2, and the voltage of the node RFCB changes from VPR to VH2. Between time t3 and time t4, the variable resistance element 80 in the reference memory cell 3 changes to a predetermined LR state.

At time t4, the voltages of the output terminals Vp0 and Vp1 of the reference memory cell write circuit 81 both return to a pre-charge voltage VPR, and the node RFCT and the node RFCB are each set to the voltage VPR again.

Since the write sequence ends at time t5, the switching control signal REFW='L', the switching element 60 is in the OFF state, the switching element 61 is the VSS selection state, and the switching element 62 is in the ON state. The node RFCT is connected to the voltage adjustment circuit 5, the read current source 78 is a voltage level (e.g., Vr00) determined according to the flowing current, and the node RFCB is a ground level (VSS).

As described above, the resistance of the variable resistance element 80 in the reference memory cell 3 can be set to a predetermined value. It should be noted that the example of the sequence in FIG. 12 shows a high resistance write operation followed by a low resistance write operation. However, in a write period from time t0 to time t5, it is possible to perform arbitrary setting operation as necessary, such as only the high resistance write, the low resistance write, or other combinations.

By setting the elements comprised in the reference memory cell 3 to be equal to those comprised in the memory cell 51, the reference memory cell 3 shows the same characteristic change as that of the memory cell 51 with respect to a process variation and a change in temperatures. As a result, the characteristic change can be automatically reflected in the reference voltage V (CLBref), and at the time of read, it is possible to reliably apply the best voltage for reading the selected memory cell on the node YD (selected bit line) by automatic adjustment on a steady basis. In other words, stable read is possible on a steady basis.

[Multiple Reference Memory Cells]

Figure 13:
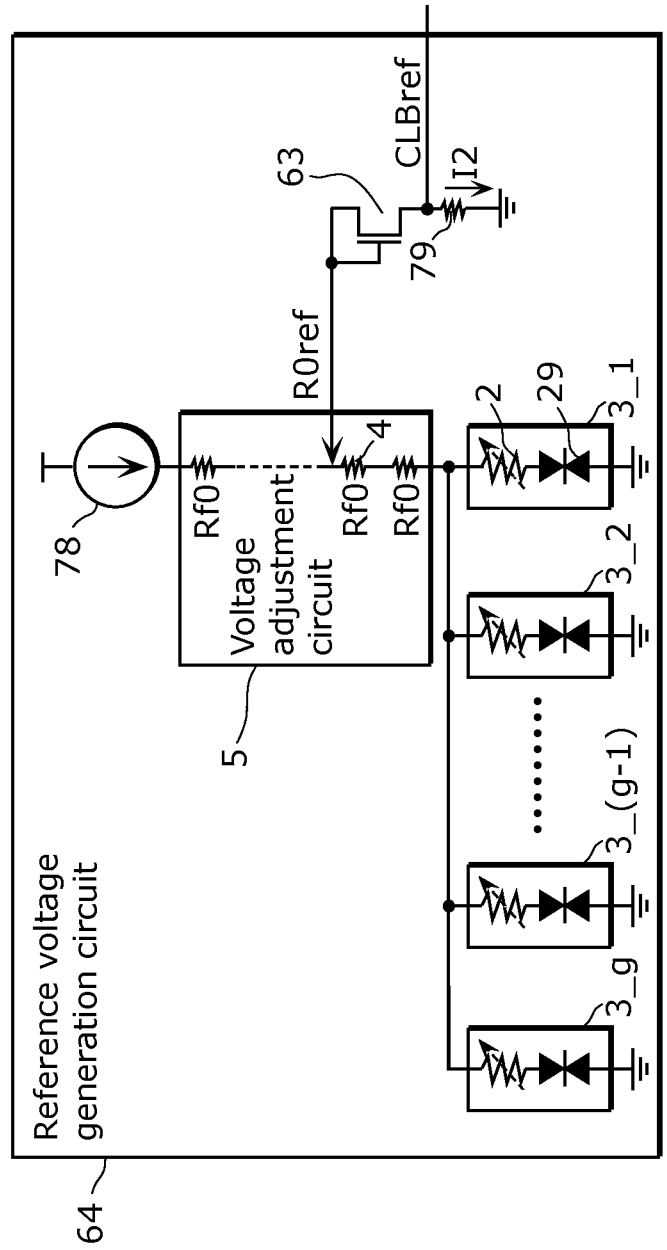
FIG. 13 is a block diagram showing an example of a reference voltage generation circuit including a plurality of reference memory cells according to Embodiment.

The above describe embodiment describes the case where the reference voltage generation circuit 6 comprises a reference memory cell 3. However, the reference memory cell 3 comprised in the reference voltage generation circuit 6, as shown in FIG. 13, may be configured by connecting a plurality of the reference memory cells 3_1, . . . 3_g in parallel. Moreover, a resistance element 2 included in each of the individual reference memory cells 3_1, . . . 3_g may be a fixed resistance element 137, or may be a variable resistance element 80. With this configuration, it is possible to average variation in the characteristics of the individual reference memory cells.

Moreover, when the variable resistance element 80 capable of adjusting the resistance value is used as the resistance element 2, it is possible to average the difference between the individually set resistance values, with the result that the more leveled reference voltage V (CLBref) can be generated on a steady basis.

Moreover, when the variable resistance element 80 is used as the resistance element 2, the switching elements 60, 61, and 62 shown in FIG. 11 are provided to each of the individual reference memory cells 3_1, . . . 3_g, and the reference memory cells 3_1, . . . 3_g each are sequentially connected to the reference memory cell write circuit 81, and the resistance value of the variable resistance element 80 may be set.

[Simplification of Reference Voltage Generation Circuit]

Figure 14:
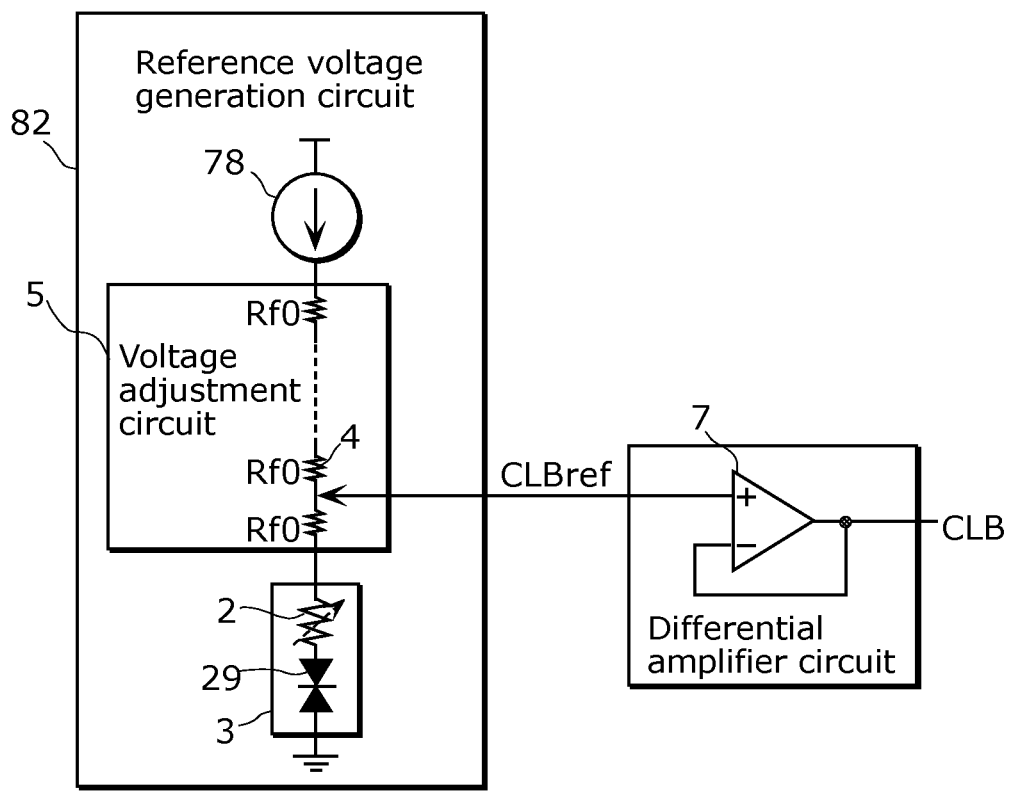
FIG. 14 is a block diagram showing an example of a second reference voltage generation circuit according to Embodiment.

The reference voltage generation circuit 82, as shown in FIG. 14, may be a configuration in which the N-channel transistor 63 and the fixed variable resistance element 79 are removed. In that case, the output voltage of the voltage adjustment circuit 5 may be reduced in order to compensate a voltage drop in the threshold voltage of the N-channel transistor 63 that occurs in the node CBLref when the N-channel transistor 63 is not removed.

For example, when the resistance element 2 is the variable resistance element 80, the resistance value of the resistance element 2 may be set to a further low resistance state. Regardless of whether the resistance element 2 is the variable resistance element 80 and the fixed resistance element 137, the voltage of the node CLBref may be dropped by removing the resistance element 2. By reducing the amount of current provided from the current source 78, the voltage of the node CLBref may be dropped. As shown in FIG. 13, the voltage of the node CLBref may be dropped by connecting in parallel a large number of the reference memory cells 3.

[Configuration of Reference Voltage Generation Circuit with Respect to Multilayer Structure]

When the memory cell array has a multilayer structure, the characteristics of the current steering elements 29 are different for each of the layers according to heating at a high temperature in the manufacturing process for each metal layer (when a lower layer memory cell has a more number of upper layer metal layers, the number of times in which the heat impact is received is increased).

The voltage of the node CBLref is a reference voltage for setting the voltage of the node YD (bit line voltage) at the time of read. Therefore, the following problem occurs when the voltage of the node CBLref is generated by the reference voltage adjustment circuit comprising the reference memory cell 3 formed in a single layer. In other words, when reading the memory cell 51 in the layer different from the layer in which the reference memory cell 3 is formed, the best voltage for reading the memory cell 51 is not applied to the node YD due to the difference between the characteristics of the reference memory cell 3 and the characteristics of the memory cell 51. As a result, the problem occurs in which the memory cell 51 cannot be normally read.

The structure of the reference voltage generation circuit for solving the above described problem when the memory cell array has a multilayer structure will be described with reference to FIG. 15.

Figure 15:
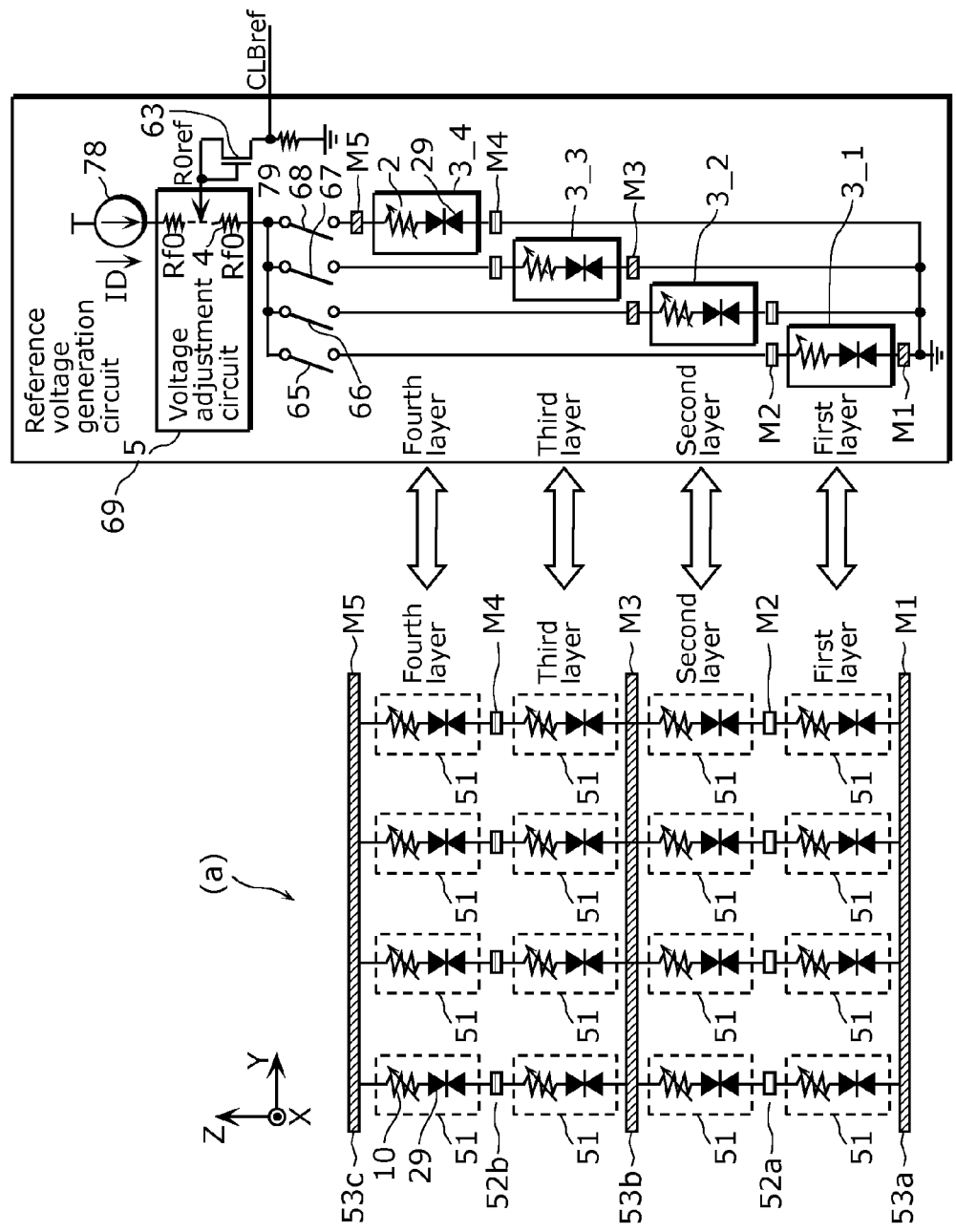
FIG. 15 is a block diagram showing an example of a cross-sectional configuration of a multilayer memory cell array according to Embodiment, and an example of a reference voltage generation circuit corresponding to the multilayer memory cell array.

FIG. 15 is a configuration diagram of the structure, seen in an X axis direction, in a Y-Z plane of the multilayer memory cell array (a) in which the memory cells 51 are stacked in four layers, and a diagram showing an example of a reference voltage generation circuit 69 which corresponds to the multilayer memory cell array (a).

In the multilayer memory cell array (a) shown in FIG. 15, a first layer bit line 53a is formed by a first metal M1. A first layer word line 52a is formed by a second metal M2 which is located above the first metal M1. A second layer bit line 53b is formed by a third metal M3 which is located above the second metal M2. A second layer word line 52b is formed by a fourth metal M4 which is located above the third metal M3. A third layer bit line 53c is formed by a fifth metal M5 which is located above the fourth metal M4.

The first layer bit line 53a, the second layer bit line 53b, and the third layer bit line 53c are extended in a Y direction. The first layer word line 52a and the second layer word line 52b are extended in the X direction which is orthogonal to the Y direction and the Z direction. The memory cell 51 is disposed at a cross-point of the bit line and the word line in each layer that are orthogonal to each other. The first end of the memory cell 51 is connected to a bit line or a word line under the memory cell 51, and the second end of the memory cell 51 is connected to a word line or a bit line above the memory cell 51.

The memory cell 51 in the first layer is disposed at each of the cross-points of the first layer bit line 53a and the first layer word line 52a, is connected to the first layer bit line 53a that corresponds to the first end, and is connected to the first layer word line 52a that corresponds to the second end.

The memory cell 51 in the second layer is disposed at each of the cross-points of the first layer word line 52a and the second layer bit line 53b, is connected to the first layer word line 52a that corresponds to the first end, and is connected to the second layer bit line 53b that corresponds to the second end.

The memory cell 51 in the third layer is disposed at each of the cross-points of the second layer bit line 53b and the second layer word line 52b, is connected to the second layer bit line 53b that corresponds to the first end, and is connected to the second layer word line 52b that corresponds to the second end.

The memory cell 51 in the fourth layer is disposed at each of the cross-points of the second layer word line 52b and the third layer bit line 53c, is connected to the second layer word line 52b that corresponds to the first end, and is connected to the third layer bit line 53c that corresponds to the second end.

The reference memory cells 3_1 to 3_4 of reference voltage generation circuit 69 may be provided corresponding to each of the layers of the multilayer memory cell array (a).

In FIG. 15, the same reference marks will be assigned to the structural elements that are the same as those as described above, and a description thereof will be omitted.

In the reference voltage generation circuit 69 in FIG. 15, the reference memory cells 3_1 to 3_4 are each provided to a layer corresponding to the multilayer memory cell array (a), and the resistance element 2 and the current steering element 29 are connected in series.

In the reference memory cell 3_1, the first end is connected to a wire comprising the first metal M1, and the second end is connected to a wire comprising the second metal M2.

In the reference memory cell 3_2, the first end is connected to a wire comprising the second metal M2, and the second end is connected to a wire comprising the third metal M3.

In the reference memory cell 3_3, the first end is connected to a wire comprising the third metal M3, and the second end is connected to a wire comprising the fourth metal M4.

In the reference memory cell 3_4, the first end is connected to a wire comprising the fourth metal M4, and the second end is connected to a wire comprising the fifth metal M5.

Moreover, the switching elements 65 to 68 which select the reference memory cell in any layer are provided.

In the switching element 65, the first end is connected to the voltage adjustment circuit 5, and the second end is connected to the second end of the reference memory cell 3_1 via the second metal M2.

In the switching element 66, the first end is connected to the voltage adjustment circuit 5, and the second end is connected to the second end of the reference memory cell 3_2 via the third metal M3.

In the switching element 67, the first end is connected to the voltage adjustment circuit 5, and the second end is connected to the second end of the reference memory cell 3_3 via the fourth metal M4.

In the switching element 68, the first end is connected to the voltage adjustment circuit 5, and the second end is connected to the second end of the reference memory cell 3_2 via the fifth metal M5.

The first end of the reference memory cell 3_1 is connected to a ground via the first metal M1, the first end of the reference memory cell 3_2 is connected to a ground via the second metal M2, the first end of the reference memory cell 3_3 is connected to a ground via the third metal M3, and the first end of the reference memory cell 3_4 is connected to a ground via the fourth metal M4.

As described above, the reference voltage generation circuit 69 corresponding to the multilayer memory cell array comprises the current source 78, the voltage adjustment circuit 5, the switching elements 65, 66, 67, and 68, and the reference memory cells 3_1, 3_2, 3_3, and 3_4. It should be noted that the current steering elements 29 of the reference memory cells 3_1 to 3_4 in the layers of the reference voltage generation circuit 69 are formed in the same manufacturing process as that of the current steering element 29 of the same memory cell 51 which corresponds to each of the layers.

Next, an operation of the reference voltage generation circuit 69 will be described.

In the reference voltage generation circuit 69, in the multilayer memory cell array (a) shown in FIG. 15, the following operation is performed by the layer in which the memory cell 51 selected as a read target is located.

When the memory cell 51 in the first layer is selected, the reference voltage generation circuit 69 sets the switching element 65 to the ON state, sets the switching element 66 to the OFF state, sets the switching element 67 to the OFF state, and sets the switching element 68 to the OFF state. With this, the current I0 generated from the current source 78 flows to the reference memory cell 3_1 in the first layer via the switching element 65, and the reference voltage V (CBLref) adapted to the characteristics of the reference memory cell 3_1 disposed in the first layer is generated in the reference voltage generation circuit 69.

When the memory cell 51 in the second layer is selected, the reference voltage generation circuit 69 sets the switching element 65 to the OFF state, sets the switching element 66 to the ON state, sets the switching element 67 to the OFF state, and sets the switching element 68 to the OFF state. With this, the current I0 generated from the current source 78 flows to the reference memory cell 3_2 in the second layer via the switching element 66, and the reference voltage V (CBLref) adapted to the characteristics of the reference memory cell 3_2 disposed in the second layer is generated in the reference voltage generation circuit 69.

When the memory cell 51 in the third layer is selected, the reference voltage generation circuit 69 sets the switching element 65 to the OFF state, sets the switching element 66 to the OFF state, sets the switching element 67 to the ON state, and sets the switching element 68 to the OFF state. With this, the current I0 generated from the current source 78 flows to the reference memory cell 3_3 in the third layer via the switching element 67, and the reference voltage V (CBLref) adapted to the characteristics of the reference memory cell 3_3 disposed in the third layer is generated in the reference voltage generation circuit 69.

When the memory cell 51 in the fourth layer is selected, the reference voltage generation circuit 69 sets the switching element 65 to the OFF state, sets the switching element 66 to the OFF state, sets the switching element 67 to the OFF state, and sets the switching element 68 to the ON state. With this, the current I0 generated from the current source 78 flows to the reference memory cell 3_4 in the fourth layer via the switching element 68, and the reference voltage V (CBLref) adapted to the characteristics of the reference memory cell 3_4 disposed in the fourth layer is generated in the reference voltage generation circuit 69.

As described above, in the cross-point variable resistance nonvolatile memory device having a multilayer memory cell array, the reference memory cells corresponding to the layers the reference voltage generation circuit are provided to the reference voltage generation circuit, the reference memory cell in the same layer as that of the selected memory cell 51 to be read is selected, and the reference voltage is generated. With this, since an appropriate read voltage corresponding to each of the layers is applied to the node YD, a stable read determination operation is possible without dependence on the layer in which the selected memory cell is located.

[Example of Memory System Configuration]

Next, an example of a system configuration of a cross-point variable resistance nonvolatile memory device according to Embodiment and an operation of the cross-point variable resistance nonvolatile memory device according to Embodiment will be described with reference to FIGS. 16 and 17. The cross-point variable resistance nonvolatile memory device comprises a read circuit described in FIG. 10.

Figure 16:
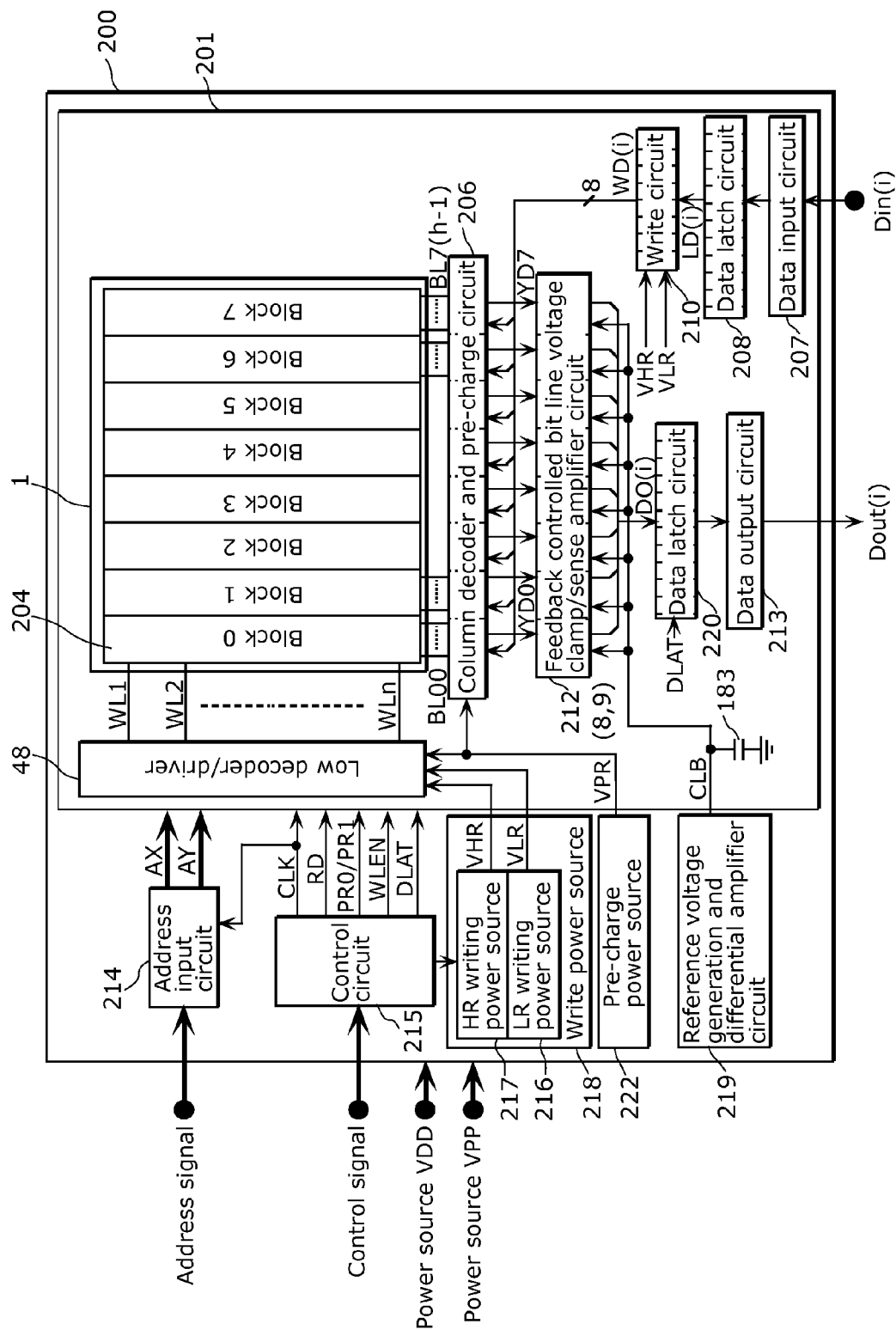
FIG. 16 is a system block diagram showing an example of a cross-point variable resistance nonvolatile memory device according to Embodiment.

FIG. 16 is a diagram showing an example of a system configuration a cross-point variable resistance nonvolatile memory device 200.

In FIG. 16, the memory cell array 1 comprises by arranging a plurality of the memory cells 51. For performing 8 bit parallel read, the memory cell array 1 is divided into eight blocks 204 of block 0 to block 7 in which the same number of bit line are arranged. A word line is wired in the same manner for all the blocks.

The low decoder/driver 48, when reading the memory cell, selectively applies a read voltage to the selection word line that is a word line connected to a memory cell to be read. Otherwise (e.g., before the application of the read voltage or the standby state), the word line is pre-charged to the pre-charge voltage VPR.

The low decoder/driver 48 may, when reading the memory cell, set a word line other than the selected word line to the Hi-z state.

A column decoder and pre-charge circuit 206, when reading the memory cell, selectively applies a read voltage to the selected word line that is a bit line connected to a memory cell to be read (eight bit lines when the memory cell array 1 is, for example, divided into eight blocks). Otherwise (e.g., before the application of the read voltage or the standby state), the bit line is pre-charged to the pre-charge voltage VPR.

The column decoder and pre-charge circuit 206 selects a predetermined one of the bit lines (total of eight bit lines) from each of the eight blocks in the memory cell array 1, and sets the unselected bit line to the pre-charge voltage VPR or to the Hi-z state.

A voltage clamp/sense amplifier circuit 212 comprises the feedback controlled bit line voltage clamp voltage circuit 8 and the sense amplifier circuit 9 in FIG. 10 that are provided to each of the blocks. In other words, the voltage clamp in the voltage clamp/sense amplifier circuit 212 is the feedback controlled bit line voltage clamp circuit 8, and the sense amplifier circuit of the voltage clamp/sense amplifier circuit 212 is the sense amplifier circuit 9.

A data latch circuit 220 stores 8 bit read data outputted from the voltage clamp/sense amplifier circuit 212 at the time of read in eight latch circuits. A data output circuit 213 outputs the 8 bit data outputted by the data latch circuit 220 to the outside of the cross-point variable resistance nonvolatile memory device 200.

A data input circuit 207 receives 8 bit write data inputted from the outside of the cross-point variable resistance nonvolatile memory device 200. The data latch circuit 208 temporarily stores the 8 bit write data received by the data input circuit 207.

A write circuit 210 is provided with the write data LD (i) outputted by the data latch circuit 208 and generates write pulse voltages for eight bits of the selected memory cells 51 which are selected by the column decoder and pre-charge circuit 206 and the low decoder/driver 48. Each of the outputs WD (i) (i=0 to 7) of the write circuit 210 is connected to a corresponding one of the blocks of the column decoder and pre-charge circuit 206.

A main memory unit 201 includes the memory array 1, the low decoder/driver 48, the column decoder and pre-charge circuit 206, the voltage clamp/sense amplifier circuit 207, the data latch circuit 220, the data output circuit 213, the data input circuit 207, the data latch circuit 208, and the write circuit 210.

A reference voltage generation and differential amplifier circuit 219 includes the reference voltage generation circuit 6 and the differential amplifier circuit 7 in FIG. 10. The node CLB connected to the output of the reference voltage generation and differential amplifier circuit 219 is connected to the smoothing capacitor 183 which limits an instantaneous voltage change of the node CLB.

Moreover, the output of the reference voltage generation and differential amplifier circuit 219 is connected to eight feedback controlled bit line voltage clamp circuits 8 comprised in the voltage clamp/sense amplifier circuit 212. In other words, the reference voltage generation and differential amplifier circuit 129 has a configuration of the eight feedback controlled bit line voltage clamp circuits 8.

A HR writing power source 217 generates a write voltage for high voltage writing. A LR writing power source 216 generates a write voltage for low voltage writing. A write power source circuit 218 comprises the HR writing power source 217 and the LR writing power source 216, and the outputs VHR and VLR are provided to the low decoder/driver 48 and the write circuit 210.

A pre-charge power source 222 generates the pre-charge voltage VPR for pre-charging the bit line and the word line, and provides the generated pre-charge voltage VPR to the low decoder/driver 48 and the column decoder and pre-charge circuit 206.

An address input circuit 214 specifies the selected memory cell according to an address signal from the outside. A control circuit 215 provides various types of control signals to the main memory unit 201 to control the main memory unit according to a control signal from the outside.

An example of a read operation in the above configured cross-point variable resistance nonvolatile memory device 200 will be described in detail according to a sequence chart in FIG. 17. The following description will be made with reference to FIG. 10 as FIG. 16 and a detailed configuration of the main part in FIG. 16.

Figure 17:
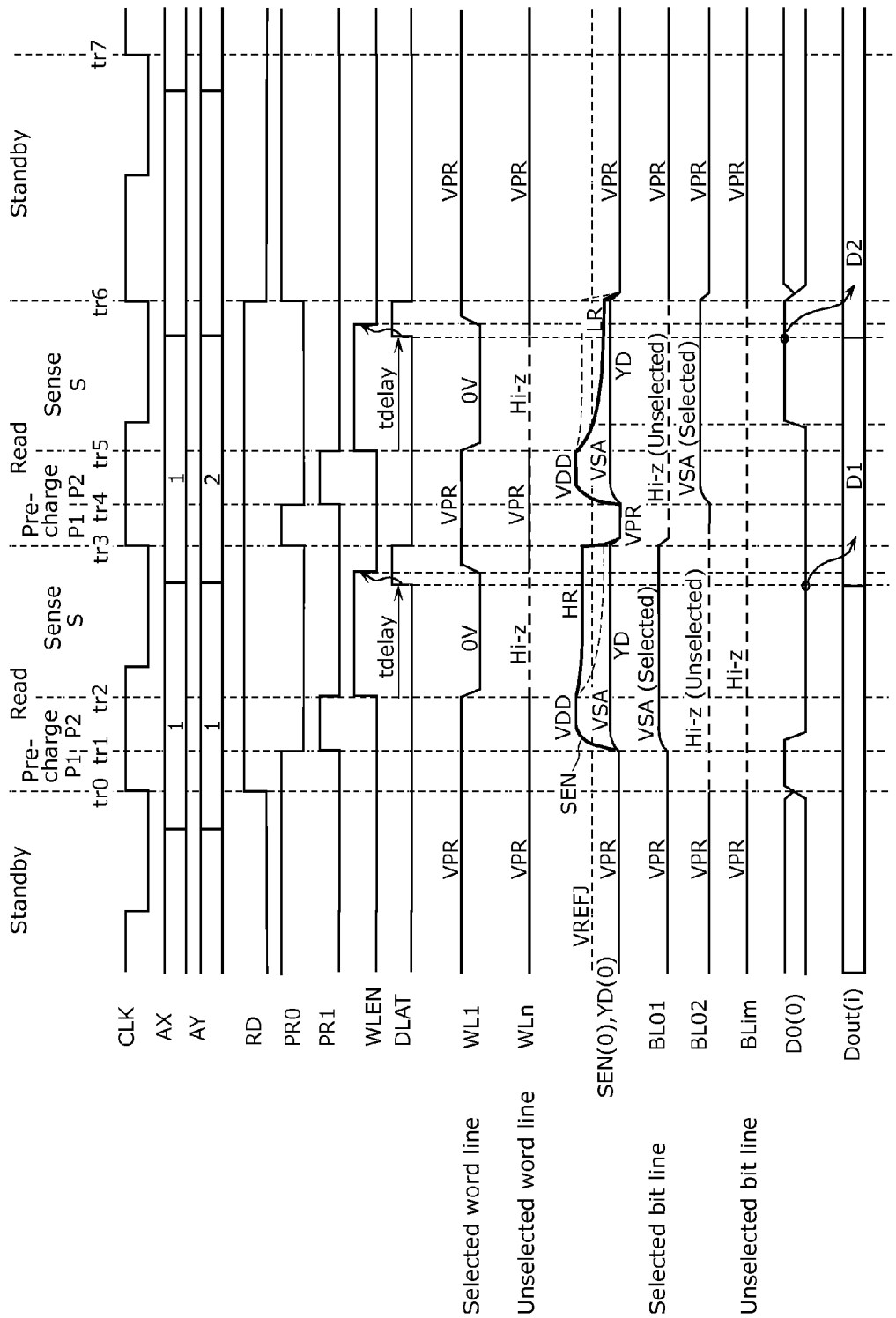
FIG. 17 is a sequence diagram showing an example of an operation of a cross-point variable resistance nonvolatile memory device according to Embodiment.

In the sequence chart in FIG. 17, a signal CLK is a clock signal outputted from the control circuit 215. A signal AX is an X address signal which is outputted from the address input circuit 214 and is inputted to the low decoder/driver 48. The signal AY is a Y address signal which is outputted from the address input circuit 214 and is inputted to the column decoder and pre-charge circuit 206. A signal RD is a signal which is outputted from the control circuit 215 and means a read mode at the time of 'H'.

A signal PR0 is a pre-charge signal which is outputted from the control circuit 215 and is for charging the node YD to the voltage VPR at the time of 'H' as shown in FIG. 10. A signal PR1 is a pre-charge signal which is outputted from the control circuit 215 and is for charging the node SEN to the power source voltage at the time of 'H' as shown in FIG. 10.

A signal WLEN is a selected word line operation timing control signal which is outputted from the control circuit 215, and is inputted to the low decoder/driver 48, and is for performing 0 V application to the selected word line in a read mode at the time of 'H'.

A signal DLAT is a signal which is outputted from the control circuit 215, is inputted to the data latch circuit 220, and controls a timing of latching a read data.

In FIG. 17, the selected memory cell is read by setting the word line WL1 to be the selection word line and by sequentially setting the bit line BLi1 and the bit line BLi2 in each of the blocks i (i=0 to 7) to be selected bit lines.

The word line WLn is an unselected word line other than the word line WL1, and the bit line BLim is an unselected bit line other than the bit lines BLi1 and BLi2 (i=1 to 7).

Before time tr0, according to RD='L', the main memory unit 201 is in the standby state. According to PR0='H', the node YD (i) is the pre-charge voltage. According to PR1='L' and RD='L', the node SEN (i) is the pre-charge voltage VPR. Moreover, all the word lines WL1 to WLn and all the bit lines BLi1 to BLim are each the pre-charge voltage VPR.

Next, in a period from time tr0 to tr3, a read operation is performed on address AX=1 and AY=1.

The read operation period includes, in this order, the first pre-charge period P1 (time tr0 to tr1), the second pre-charge period P2 (time tr1 to tr2), and the sense period S (time tr2 to tr3).

At time tr0 the first pre-charge period starts and the signal RD becomes 'H'. When the signal RD is 'H', the P-channel transistor 42 and the P-channel transistor 45 are in the ON state, and the differential sensing circuit 46 is in the operation state.

Between time tr0 to tr1, the signal PR0 is held at 'H'. The node YD (i) and the selected bit line BLi1 continues to be pre-charged to the pre-charge voltage VPR. The unselected bit lines BLi2 and BLim are in the Hi-z state.

At time tr1 the second pre-charge period starts, the signal PR0 becomes 'L', and the pre-charge of the node YD (i) and the selected bit line BLi1 change to OFF. The signal PR1 becomes 'H', and then the voltage VDD is applied to the node SEN (i). With a feedback operation of the feedback controlled bit line voltage clamp circuit 8, the node YD and the selected bit line BLi1 increase to the read voltage VSA in a short time.

At time tr2 the sense period starts, the signal PR1 becomes 'L.' Then, the application of the voltage VDD to the node SEN (i) is stopped. The signal WLEN becomes 'H,' the selected word line WL1 changes from the pre-charge voltage VPR to 0 V, and the unselected word line WLn changes to Hi-z.

Between time tr2 and tr3, the read voltage VSA is applied to the selected memory cell. The sense amplifier circuit 9 determines the state of the selected memory cell according to the amount of current flowing through the selected memory cell.

If the predetermined selected memory cell belonging to block 0 is in the high resistance state between time tr2 and tr3, the current flowing through the selected memory cell is small and the load current provided from the P channel transistor 45 of the sense amplifier circuit 9 is greater than the amount of current flowing through the selected memory cell. As a result, the voltage of the node SEN (0) is almost held at VDD. Since the voltage of the node SEN is greater than the determination reference voltage VREFJ, the data signal DQ (0) outputted from the sense amplifier 9 is 'L'.

After the time period tdelay passed from time tr2, the signal DLAT becomes 'H'. The 'L' state of the data signal DQ (0) is latched by the data latch circuit 220. The output of the data latch circuit 220 is outputted to Dout (0) via the data output circuit 213.

At time tr3, a read mode on address AX=1 and AY=2 starts.

The read signal RD continues to be 'H', and the signal PR0 continues to be 'L'. According to RD=H, the P-channel transistor 42 and the P-channel transistor 45 are in the ON state, and the differential sensing circuit 46 is in the operation state.

The read operation period includes, in this order, the first pre-charge period P1 (time tr3 to tr4), the second pre-charge period P2 (time tr4 to tr5), and the sense period S (time tr5 to tr6).

At time tr3 the first pre-charge period starts, and the signal RD continues to be 'H'. Since the signal RD is 'H', the P-channel transistor 42 and the P-channel transistor 45 are in the ON state, and the differential sensing circuit 46 is in the operation state.

At time tr3 the first pre-charge period starts, and the signal PR0 becomes 'H'. The node YD (i) and the selected bit line BLi2 continue to be pre-charged to the pre-charge voltage VPR. The unselected bit lines BLi1 and BLim are in the Hi-z state.

At time tr4 the second pre-charge period starts, the signal PR0 becomes 'L', and the pre-charge of the node YD (i) and the selected bit line BLi2 change to OFF. The signal PR1 becomes 'H', and then the voltage VDD is applied to the node SEN (i). With a feedback operation of the feedback controlled bit line voltage clamp circuit 8, the voltage of the selected bit line BLi2 connected to the node YD increases to the read voltage VSA in a short time.

At time tr5 the sense period starts, and the signal PR1 becomes 'L.' Then, the application of the voltage VDD to the node SEN (i) is stopped. The signal WLEN becomes 'H,' the selected word line WL1 changes from the pre-charge voltage VPR to 0 V, and the unselected word line WLn changes to Hi-z.

Between time tr5 and tr6, the read voltage VSA is applied to the selected memory cell. The sense amplifier circuit 9 determines the state of the selected memory cell according to the amount of current flowing through the selected memory cell.

If the state of the selected memory cell in block 0 is in the low resistance state between tr5 and tr6, for example, the current flowing through the selected memory cell is great, and the load current amount provided from the P-channel transistor 45 of the sense amplifier 9 is smaller than the amount of current flowing through the selected memory cell. As a result, the voltage of the node SEN (0) is decreased. When the voltage of the node SEN is lower than the determination reference voltage VREFJ, the data signal DQ (0) outputted from the sense amplifier 9 changes to 'H'.

After the time period tdelay passed from time tr5, the signal DLAT becomes 'H'. The 'H' state of the data signal DQ (0) is latched by the data latch circuit 220. The output of the data latch circuit 220 is outputted to Dout (0) via the data output circuit 213.

At time tr6, since the signal RD becomes 'L' and the signal PR0 becomes 'H', the main memory unit is in the standby state. According to RD='L', the P-channel transistor changes to the OFF state. According to PR0='H', the node YD (i) becomes the pre-charge voltage VPR, and the node (SEN) (i) becomes the pre-charge voltage VPR according to PR1='L' and RD='L'. Moreover, the voltages of all the word lines WL1 to WLn and all the bit lines BLi1 to BLim are each set to the pre-charge voltage VPR.

To sum up the above described operation, among the first pre-charge period P1, the second pre-charge period P2, and the sense period S that are included, in this order, in the period of a read operation that determines whether the variable resistance element in the selected memory cell is in the low resistance state or the high resistance state, in the first pre-charge period P1, by the column decoder and pre-charge circuit 206, the selected bit line which is a line at least connected to the selected memory cell among the bit lines BL1 to BLm is pre-charged to the pre-charge voltage VPR which is an example of the first voltage.

In the first pre-charge period P1 and the second pre-charge period P2, by the low decoder/driver 48, among the word lines WL1 to WLn, the selected word line which is a word line at least connected to the selected memory cell is pre-charged to the pre-charge voltage VPR which is an example of the first voltage. Moreover, in the sense period 5, by the low decoder/driver 48, the selected word line is set to 0 V which is an example of the third voltage different from the first voltage.

In the second pre-charge period P2 and the sense period S, by the feedback controlled bit line voltage clamp circuit 8, the selected bit line is set to and held at the read voltage VSA which is an example of the second voltage.

Then, in the sense period S, by the sense amplifier circuit 9, whether the variable resistance element in the selected memory cell is in the low resistance state or the high resistance state is determined by the amount of current flowing through the selected memory cell.

Furthermore, in the standby state, by the column decoder and pre-charge circuit 206 and the low decoder/driver 48, all the bit lines BL1 to Blm and all the word lines WL1 to WLn are pre-charged to the pre-charge voltage VPR.

As described above, according to the cross-point variable resistance nonvolatile memory device, in the standby state, since all the bit lines and all the word lines of the memory cell array 1 are set to the pre-charge voltage VPR, the current flowing in the memory cell array 1 comes to stop. Furthermore, since the feedback controlled bit line voltage clamp circuit 8 and the sense amplifier circuit 9 are stopped, unnecessary current is reduced.

Meanwhile, in the read operation, just after the start of the read operation, the feedback controlled bit line voltage clamp circuit 8 and the sense amplifier circuit 9 start operation, and set the selected bit line voltage to the read voltage VSA in a short time. Therefore, a cycle of the read operation can be performed in an extremely short time of no more than 50 ns, and it is possible to realize a read operation at a very high speed. With this, it is possible to provide a cross-point variable resistance nonvolatile memory device which reduces power consumption and performs at a high speed.

The above described pre-charge operation is performed in two stages of the first pre-charge period P1 from time tr0 (tr3) to tr1 (tr4) and the second pre-charge period P2 from time tr1 (tr4) to tr2 (tr5).

In the pre-charge period P1, by turning ON the switching element 44, the node YD and the selected bit line are set to the pre-charge voltage VPR. In the pre-charge period P2, the switching element 44 is OFF and the pre-charge of VPR is stopped, and then the switching element is ON and by the feedback controlled bit line voltage clamp circuit 8, the node YD and the selected bit line are set to the read voltage VSA (VSA>VPR).

The following is the reason why the selected bit line is pre-charged in two stages, through the node YD, to the pre-charge voltage VPR in the first pre-charge period P1 and to the read voltage VSA in the second pre-charge period P2.

The memory cell array 1 comprising a large number of word lines 24, a large number of bit lines 25, and a large number of memory cells 51 has a relatively large parasitic capacitance caused by the circuit size.

Therefore, when 0 V is applied to the selected word line at the time of sense, electric charge charged in a parasitic capacitance of the memory cell array 1 intensively flows, according to the level of the pre-charge voltage VPR before sense, to the selected word line via the unselected memory cell. Consequently, the voltage of the selected word line increases from 0V. An amount of increase in the voltage of the selected word line at this time is high when the pre-charge voltage VPR is high. An amount of increase in the voltage of the selected word line is low when the pre-charge VPR is low.

Meanwhile, when the pre-charge voltage VPR is low, current flowing from the sense amplifier circuit includes not only the current flowing through the selected memory cell but also charging current which charges the parasitic capacitance of the memory cell array 1 via the unselected memory cell. As a result, it is difficult to accurately determine the resistance state by the current sense.

Therefore, the pre-charge voltage VPR needs to be set to a potential in which an increase in potential of the selected word line is small at the time of sense, and charging current which charges the parasitic capacitance of the memory cell array 1 is restricted. Therefore, it is effective that the pre-charge voltage VPR needs to be set to the best voltage which is lower than the read voltage VSA.

As a result of the consideration, the two-stage pre-charge is performed. That is, in the first pre-charge period P1, all the bit lines of the memory cell array 1 is pre-charged to the pre-charge voltage VPR through the node YD. In the second pre-charge period P2, only the selected bit line is pre-charged to the read voltage VSA through the node YD.

With this, since an increase in the potential of the selected word line at the time of read is restricted and current other than the selected memory cell current is restricted, most of the current flowing from the sense amplifier circuit is the selected memory cell current. As a result, the sense amplifier circuit can detect with high accuracy the resistance state of the selected memory cell (i.e., data stored in the selected memory cell).

[Pre-Charge Voltage Generation Circuit Linked to Threshold of Current Steering Element]

Figure 18:
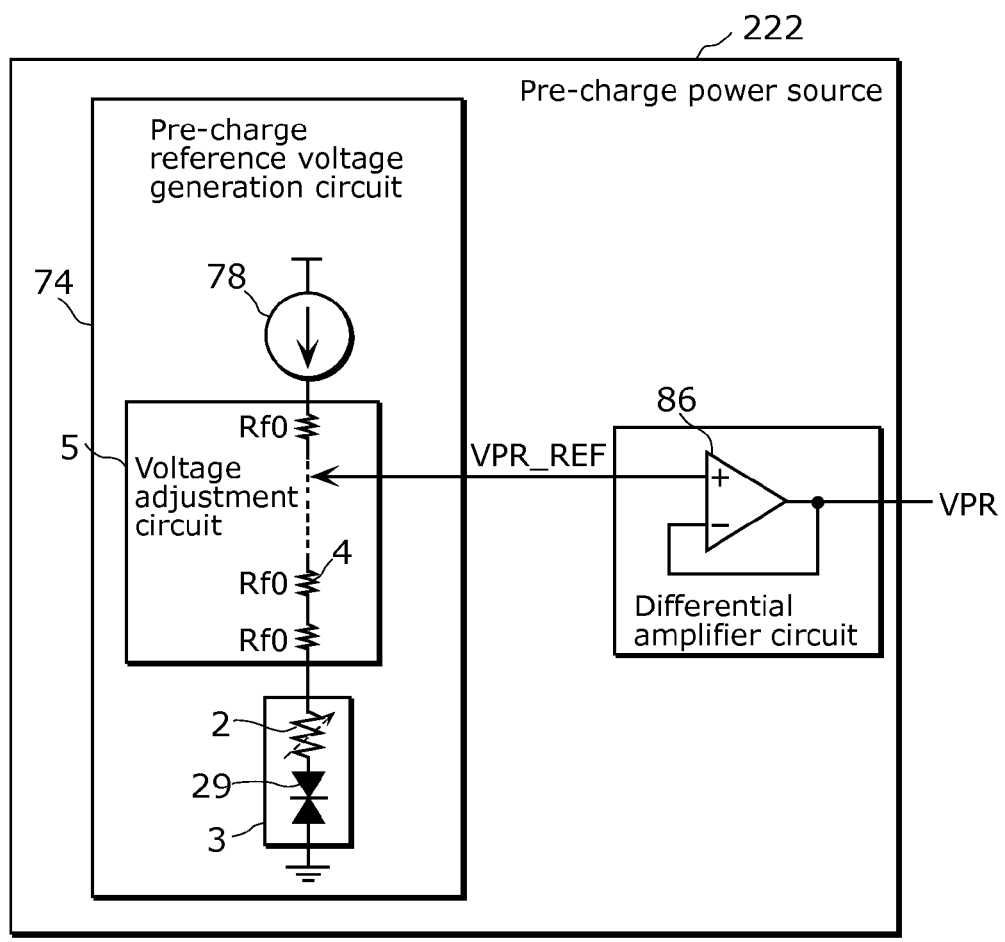
FIG. 18 is a block diagram showing an example of a pre-charge voltage generation circuit according to Embodiment.

Next, FIG. 18 shows an example of a configuration of a pre-charge voltage generation circuit linked to a threshold of a current steering element.

In FIG. 18, the same reference marks will be assigned to the structural elements that are the same as those as described above, and a description thereof will be omitted.

A pre-charge reference voltage generation circuit 74 shown in FIG. 18, as similarly to the reference voltage generation circuit 82 in FIG. 14, connects in series, between the VDD power source and the ground in this order, the power source 78, the voltage adjustment circuit 5, and the reference memory cell 3. The voltage adjustment circuit 5 is connected in series to a plurality of the fixed resistance elements 4.

The output voltage VPR_REF selectively outputted from the voltage adjustment circuit 5 is a reference voltage equal to a predetermined pre-charge voltage. The pre-charge voltage VPR is a voltage which is lower than the read voltage VSA (VPR<VSA). Therefore, the voltage VPR_REF provided from the voltage adjustment circuit 5 of the pre-charge reference voltage generation circuit 74 is a voltage which is lower than the read voltage VSA (VPR_REF=VPR<VSA).

The pre-charge reference voltage generation circuit 74 provides a pre-charge reference voltage VPR_REF which is different from the reference voltage CLBref provided from the reference voltage generation circuit 6.

The pre-charge reference voltage VPR_REF provided from the pre-charge reference voltage generation circuit 74 is inputted to a non-inverting input terminal of a differential amplifier circuit 86. The output terminal of the inverting input terminal is connected for feedback, and the voltage VPR which receives current amplification equal to the pre-charge reference voltage VPR_REF is outputted from the output terminal.

The voltage adjustment circuit 5 of the reference voltage generation circuit 6 is shared as the pre-charge reference voltage generation circuit 74. In this case, the voltage R0ref is provided from the first output terminal of the voltage adjustment circuit 5 included in the reference voltage generation circuit 6, and the voltage VPR_REF is selectively provided from the second output terminal. A differential amplifier circuit is additionally provided for the pre-charge voltage generation. From the differential amplifier circuit, the voltage VPR is provided which is equal to VPR_REF and receives current amplification.

In the current steering element 29 comprised in the memory cell, when a voltage is applied to both ends, a very small amount of leakage current depending on the voltage flows even if the voltage is no more than the threshold voltage of the current steering element 29. Therefore, the current flowing via the node YD at the time of read includes not only the current flowing through the selected memory cell but also leakage current flowing through the unselected memory cell. When a voltage between the selected bit line and the unselected bit line is constant on a steady basis, the amount of leakage current is constant. Therefore, variation in read determination caused by a change in the amount of leakage current can be eliminated.

According to the pre-charge reference voltage generation circuit 74, as similarly to the adjustment of the read voltage VSA by the reference voltage generation circuit 6, the pre-charge voltage VPR is adjusted in conjunction with a change in threshold of the current steering element 29 included in the reference memory cell 3. Since the read voltage VSA applied to the selected bit line and the pre-charge voltage VPR applied to the unselected word line are both linked to a change in threshold of the current steering element 29, the voltage between the selected bit line and the unselected word line is almost constant on a steady basis. As a result, variation in read determination caused by a change in the amount of leakage current can be restricted.

As described above, when the threshold of the current steering element 29 is changed, the leakage current flowing via the unselected memory cell can be constant. Therefore, it is possible to perform stable read determination.

[Determination Voltage Switching Circuit]

Figure 19:
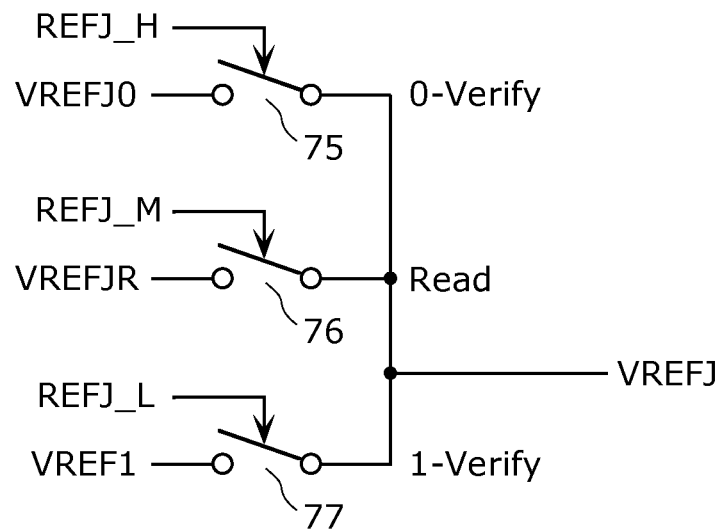
FIG. 19 is a block diagram showing an example of a determination voltage switching circuit according to Embodiment.

Next, a determination voltage switching circuit which selectively switches the determination reference voltage VREFJ at the time of read is shown in FIG. 19.

Before the configuration of the determination voltage switching circuit is described, the need of the determination voltage switching circuit will be described with reference to FIG. 20.

Figure 20:
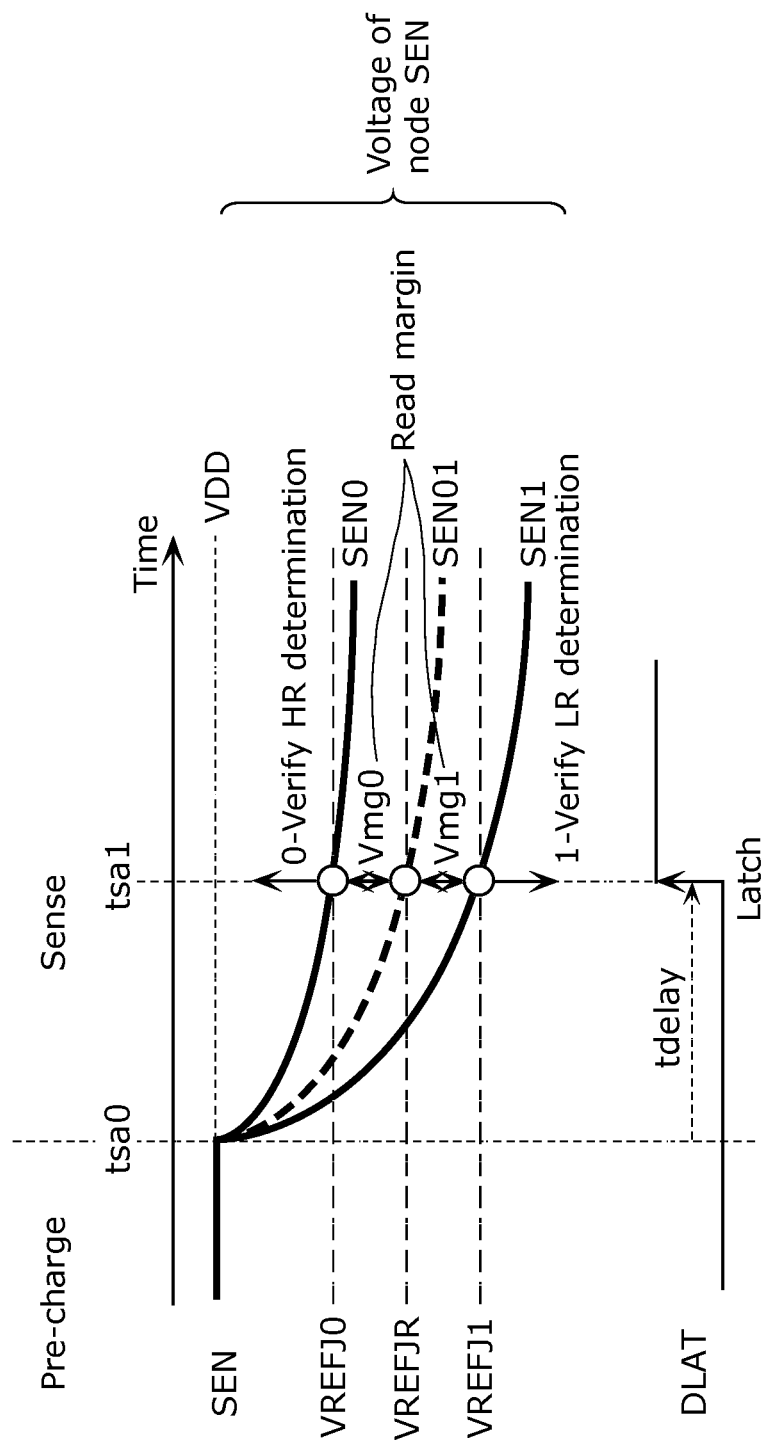
FIG. 20 is a diagram explaining an example of a read operation according to Embodiment.
Figure 21:
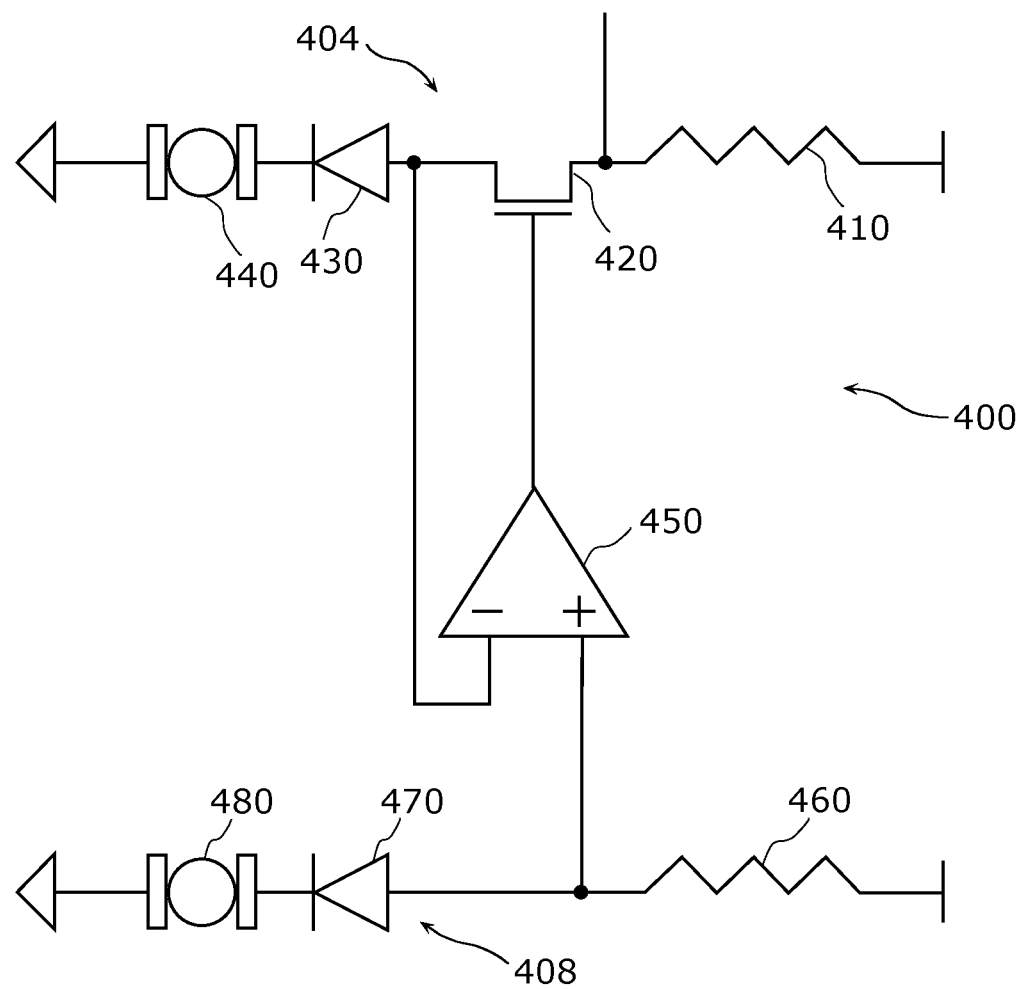
FIG. 21 is a block diagram showing an example of a voltage system used in a conventional cross-point variable resistance nonvolatile memory device.
Figure 22:
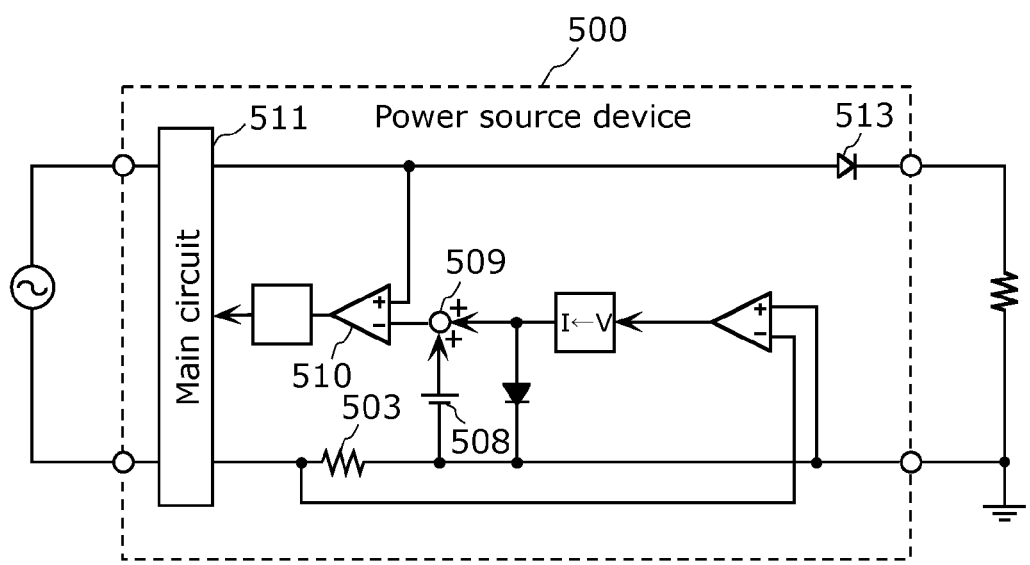
FIG. 22 is a block diagram showing an example of a power source device using a conventional differential amplifier.

FIG. 20 is a diagram describing in detail the voltage of the node SEN shown in the sequence chart in FIG. 17 and a temporal change in the signal DLAT. A horizontal axis is a time axis. Time tsa0 is the time identical to tr2 in the sequence in FIG. 20.

In the pre-charge state before time tsa0, the voltage of the node SEN is set to VDD.

At time tsa0, when the state is switched to the sense state and the voltage of the selected word line is 0 V (illustration is omitted because it is the same operation as that in FIG. 17), current according to the resistance state of the variable resistance element 10 of the selected memory cell 51 flows, and the voltage of the node SEN drops according to the amount of current.

For example, a temporal change in the node SEN, when the resistance state of the variable resistance element 10 include three types of high resistance, middle resistance, and low resistance, shows characteristics of VSEN0 in the case of high resistance. Since the middle resistance allows current to flow more than the high resistance, the middle resistance shows characteristics of VSEN01. Since the low resistance allows current to flow more than the middle resistance, the low resistance shows characteristics of VSEN1.

Three types of the determination reference voltages exist, corresponding to the three types of resistance states. The determination reference voltages are VREFJ0, VREFJR, and VREFJ1 (VREFJ0>VREFJR>VREFJ1). The difference between VREFJ0 and VREFJR is Vmg0, and the difference between VREFJR and VREFJ1 is Vmg0.

VREFJ0 and VREFJ1 are used when a verify read operation is performed for checking whether or not the write level satisfies a predetermined reference value after write is performed on the variable resistance element 10 of the selected memory cell 30. For example, after high resistance write is performed, verify read is performed by setting the determination reference voltage VREFJ to VREFJ0 level.

In the case of the verify read, as similarly to the time of the normal read, the signal DO outputted from the differential sensing circuit 46 is latched by the data latch circuit 220 at time tsa1 after the passage of time period tdelay from time tsa0 when the sense operations starts. The data latch is performed by changing the signal DLAT from 'L' to 'H'.

For example, in the verify read after the high resistance write, at time tsa1, the voltage V of the node SEN after the high resistance write is compared with the zero determination reference voltage VREFJ0. In the case of V (SEN0)<VREFJ0, the latched output signal Dout becomes 'H', the high resistance state is not determined as being no less than the prescribed level. Then, high resistance write is performed again. In the case of V (SEN0)≥VREFJ0, the high resistance state is not determined as being no less than the prescribed level. Therefore, high resistance write is not performed again.

Moreover, in the verify read after the low resistance write, at time tsa1, the voltage V of the node SEN at the time of low resistance write is compared with one determination reference voltage VREFJ1. In the case of V (SEN1)>VREFJ1, the latched output signal Dout becomes 'L'. The low resistance state is not determined as being no more than the prescribed level. Therefore, low resistance write is performed again. In the case of V (SEN1)≤VREFJ1, the low resistance state is not determined as being no less than the prescribed level. Therefore, low resistance write is not performed again.

As described above, VREFJ0 and VREFJ1 are used as a verify determination reference voltage for determining the state after write of the variable resistance element 10. VREFR is a middle voltage between VREFJ0 and VREFJ1 and is a determination reference voltage of normal read. The difference Vmg0 between VREFJ0 and VREFR is a Read margin for the high resistance state, and the difference Vmg1 between VREFJ1 and VREFR is a Read margin for the low resistance state.

As described above, three types are prepared as the determination reference voltage, that is, the verify determination reference voltage VREFJ0 which checks the state of the variable resistance element after high resistance write, the verify determination reference voltage VREFJ1 which checks the state of the variable resistance element after low resistance write, and the determination reference voltage VREFR which read the state of the variable resistance element at the time of normal read. Among the three types of determination reference voltages, the voltage meeting the purpose of the determination is selected as the determination reference voltage VREFJ.

The switch between the determination reference voltages is realized by a determination voltage switching circuit shown in FIG. 19.

In FIG. 19, the switching element 75 switches whether or not the voltage VREFJ0 is transmitted to the node VREFJ according to the control signal REFJ_H, changes to the ON state at the time of REFJ_H='H' (0—at the time of verify read), and transmits the voltage VREFJ0 to the node VREFJ.

The switching element 76 switches whether or not the voltage VREFJR is transmitted to the node VREFJ according to the control signal REFJ_M, changes to the ON state at the time of REFJ_M='H' (at the time of normal read), and transmits the voltage VREFJR to the node VREFJ.

The switching element 77 switches whether or not the voltage VREFJ1 is transmitted to the node VREFJ according to the control signal REFJ_L, changes to the ON state at the time of REFJ_L='H' (1—at the time of verify read), and transmits the voltage VREFJL to the node VREFJ.

It should be noted that it is necessary to be aware that any one of the control signals REFJ_H, REFJ_M, and REFJ_L becomes 'H'.

As described above, with the determination voltage switching circuit according to the present disclosure, an instantaneous and easy setting change is possible, according to the mode, for the determination reference voltage corresponding to the state determination and the read determination after the write of the variable resistance element 10. For the normal read, since the resistance value of the variable resistance element 10 can be set to a state in which the resistance state has a sufficient margin, it is possible to provide a cross-point variable resistance nonvolatile memory device which is capable of reliably reading.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present invention.

INDUSTRIAL APPLICABILITY

A disclosed cross-point variable resistance nonvolatile memory device, in a circuit method of the reference voltage rise sense amplifier linked to a threshold of the current steering element, in the cross-point memory cell, can reduce power consumption by stopping the read circuit in the case of other than read, and can perform high speed read by setting the best voltage in a short time at the time of read of the selected memory cell.

Furthermore, by introducing the two stage pre-charge in which pre-charge at the time of read is pre-charged for the whole of the memory cell array and then the selected bit line is pre-charged, it is possible to perform a more stable read operation which restricts a voltage shift of the selected word line.

A disclosed cross-point variable resistance nonvolatile memory device is useful as a nonvolatile memory of a mobile electronic device which requires low power consumption and stable and high speed read.

The invention claimed is:

1. A cross-point variable resistance nonvolatile memory device comprising:
   a cross-point memory cell array including memory cells each including (i) a variable resistance element that reversibly changes at least between a low resistance state and a high resistance state when different voltages are applied to the variable resistance element and (ii) a current steering element that is connected in series with the variable resistance element and has nonlinear current-voltage characteristics, the memory cells being placed at respective cross-points of a plurality of bit lines and a plurality of word lines;
   a column decoder and pre-charge circuit which pre-charges a selected bit line to a first voltage in a first pre-charge period among the first pre-charge period, a second pre-charge period, and a sense period that are included in this order in a period of a read operation which determines whether a selected memory cell selected from the memory cells is in the low resistance state or the high resistance state, the selected bit line being one of the bit lines which is connected to at least the selected memory cell;
   a low decoder driver which pre-charges a selected word line to the first voltage in the first pre-charge period and the second pre-charge period, and which sets the selected word line to a third voltage in the sense period, the selected word line being one of the word lines which is connected to at least the selected memory cell, the third voltage being different from the first voltage;
   a feedback controlled bit line voltage clamp circuit which sets the selected bit line to a second voltage and maintains the second voltage in the second pre-charge period and the sense period; and
   a sense amplifier circuit which determines in the sense period, according to an amount of current flowing through the selected memory cell, whether the variable resistance element in the selected memory cell is in the low resistance state or the high resistance state.

2. The cross-point variable resistance nonvolatile memory device according to claim 1,
   wherein the feedback controlled bit line voltage clamp circuit includes:
   a first transistor having a source terminal connected to a reference voltage and having a gate terminal connected to the selected bit line; and
   a second transistor which provides and stops providing a current to the selected bit line according to a voltage of a drain terminal of the first transistor.

3. The cross-point variable resistance nonvolatile memory device according to claim 1,
   wherein the feedback controlled bit line voltage clamp circuit includes a first N-channel transistor, a second N-channel transistor, a P-channel transistor, and a switching element,
   a source terminal of the first N-channel transistor is electrically connected to the selected memory cell,
   a gate terminal of the second N-channel transistor is electrically connected to the selected memory cell,
   a gate terminal of the first N-channel transistor is connected to a drain terminal of the second N-channel transistor,
   the drain terminal of the second N-channel transistor is electrically connected to a drain terminal of the P-channel transistor,
   a source terminal of the P-channel transistor is connected to a power source terminal,
   a source terminal of the second N-channel transistor is connected to a reference voltage,
   a drain terminal of the first N-channel transistor is connected to one of ends of the switching element, and
   the other of the ends of the switching element is connected to the power source terminal.

4. The cross-point variable resistance nonvolatile memory device according to claim 3,
   wherein the switching element electrically connects, in the second pre-charge period, the power source terminal and the drain terminal of the first N-channel transistor.

5. The cross-point variable resistance nonvolatile memory device according to claim 3,
   wherein the sense amplifier circuit includes a constant current element which outputs a constant current from an output terminal, and a differential sensing circuit which outputs a signal according to a comparison result of two input voltages that are an input voltage provided to a first input terminal and an input voltage provided to a second input terminal,
   the first input terminal of the differential sensing circuit is connected to a determination reference voltage, and
   the output terminal of the constant current element is connected to the second input terminal of the differential sensing circuit and the drain terminal of the first N-channel transistor.

6. The cross-point variable resistance nonvolatile memory device according to claim 5,
   wherein the constant current element includes a P-channel transistor having a source terminal and a well terminal which are connected to a power source voltage, and a drain terminal which is the output terminal.

7. The cross-point variable resistance nonvolatile memory device according to claim 1,
   wherein the low decoder driver also pre-charges a word line other than the selected word line to the first voltage in the first pre-charge period.

8. The cross-point variable resistance nonvolatile memory device according to claim 1,
   wherein the column decoder and pre-charge circuit also pre-charges a bit line other than the selected bit line to the first voltage in the first pre-charge period.

9. The cross-point variable resistance nonvolatile memory device according to claim 1, wherein the low decoder driver puts, in the sense period, an unselected word line into a high impedance state, the unselected word line being a word line other than the selected word line among the word lines, and the column decoder and pre-charge circuit puts, in the sense period, an unselected bit line into a high impedance state, the unselected bit line being a bit line other than the selected bit line among the bit lines.

10. The cross-point variable resistance nonvolatile memory device according to claim 1, wherein the column decoder and pre-charge circuit puts, in the second pre-charge period and the sense period, an unselected bit line into a high impedance state, the unselected bit line being a bit line other than the selected bit line among the bit lines.

11. A reading method for a cross-point variable resistance nonvolatile memory device, the cross-point variable resistance nonvolatile memory device including: a cross-point memory cell array including memory cells each including, at respective cross-points of a plurality of bit lines and a plurality of word lines; a column decoder and pre-charge circuit, (i) a variable resistance element that reversibly changes at least between a low resistance state and a high resistance state when different voltages are applied to the variable resistance element and (ii) a current steering element that is connected in series with the variable resistance element and has nonlinear current-voltage characteristics; a column decoder and pre-charge circuit; a low decoder driver; a feedback controlled bit line voltage clamp circuit; and a sense amplifier circuit, the method comprising:

pre-charging a selected bit line to a first voltage in a first pre-charge period among the first pre-charge period, a second pre-charge period, and a sense period that are included in this order in a period of a read operation which determines whether a selected memory cell selected from the memory cells is in the low resistance state or the high resistance state, the selected bit line being one of the bit lines which is connected to at least the selected memory cell, the pre-charging being performed by the column decoder and pre-charge circuit;

pre-charging a selected word line to the first voltage in the first pre-charge period and the second pre-charge period, and setting the selected word line to a third voltage in the sense period, the selected word line being one of the word lines which is connected to at least the selected memory cell, the third voltage being different from the first voltage, the pre-charging and setting being performed by the low decoder driver;

setting the selected bit line to a second voltage, and maintaining the second voltage in the second pre-charge period and the sense period, the setting and maintaining being performed by the feedback controlled bit line voltage clamp circuit; and determining, in the sense period, according to an amount of current flowing through the selected memory cell, whether the variable resistance element in the selected memory cell is in the low resistance state or the high resistance state, the determining being performed by the sense amplifier circuit.

12. The reading method for a cross-point variable resistance nonvolatile memory device according to claim 11, wherein the low decoder driver also pre-charges, in the first pre-charge period, a word line other than the selected word line to the first voltage.

13. The reading method for a cross-point variable resistance nonvolatile memory device according to claim 11, wherein the column decoder and pre-charge circuit also pre-charges, in the first pre-charge period, a bit line other than the selected bit line to the first voltage.

14. The reading method for a cross-point variable resistance nonvolatile memory device according to claim 11, wherein the low decoder driver puts, in the sense period, an unselected word line into a high impedance state, and the column decoder and pre-charge circuit put, in the sense period, an unselected bit line into a high impedance state, the unselected word line being a word line other than the selected word line among the word lines, the unselected bit line being is a bit line other than the selected bit line among the bit lines.

15. The reading method for a cross-point variable resistance nonvolatile memory device according to claim 11, wherein the column decoder and pre-charge circuit puts, in the second pre-charge period and the sense period, an unselected bit line into a high impedance state, the unselected bit line being a bit line other than the selected bit line among the bit lines.

16. The reading method for a cross-point variable resistance nonvolatile memory device according to claim 11, wherein the feedback controlled bit line voltage clamp circuit includes a transistor and a switching element, the selected bit line is electrically connected to a source terminal of the transistor, one of ends of the switching element is connected to a drain terminal of the transistor, and the other of the ends of the switching elements is connected to a power source, the transistor sets, in the second pre-charge period and the sense period, the selected bit line to the second voltage and maintains the second voltage with a voltage clamp operation, and the switching element is in an ON state only in the second pre-charge period.

17. The reading method for a cross-point variable resistance nonvolatile memory device according to claim 11, wherein in the sense period, in the sense amplifier circuit, whether a variable resistance element in the selected memory cell is in a high resistance state or a low resistance state is determined by comparison between (i) a voltage of the drain terminal of the transistor of the feedback controlled bit line voltage clamp circuit and (ii) a read determination reference voltage.

\* \* \* \* \*